(12) United States Patent
Kanagawa

(10) Patent No.: US 10,601,424 B1
(45) Date of Patent: Mar. 24, 2020

(54) SEMICONDUCTOR DEVICE

(71) Applicant: Toshiba Memory Corporation, Tokyo (JP)

(72) Inventor: Naoaki Kanagawa, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/286,528

(22) Filed: Feb. 26, 2019

(30) Foreign Application Priority Data

Sep. 14, 2018 (JP) .................................. 2018-171996

(51) Int. Cl.
| | | |
|---|---|---|
| *H05B 37/02* | (2006.01) | |
| *H05B 33/08* | (2006.01) | |
| *H03K 19/0944* | (2006.01) | |
| *H03K 19/20* | (2006.01) | |
| *H01L 27/02* | (2006.01) | |
| *H01L 27/088* | (2006.01) | |

(52) U.S. Cl.
CPC ... *H03K 19/09441* (2013.01); *H01L 27/0207* (2013.01); *H01L 27/088* (2013.01); *H03K 19/20* (2013.01)

(58) Field of Classification Search
CPC .............. H03K 19/09441; H03K 19/20; H01L 27/088; H01L 27/0207
See application file for complete search history.

(56) References Cited

U.S. PATENT DOCUMENTS

| | | | |
|---|---|---|---|
| 8,039,874 B2 | 10/2011 | Eimitsu et al. | |
| 8,769,476 B2 | 7/2014 | Lee et al. | |
| 8,772,880 B2 | 7/2014 | Fukuda et al. | |
| 9,209,182 B2* | 12/2015 | Chern | H01L 27/0207 |
| 2006/0275995 A1* | 12/2006 | Furuta | G11C 11/4125 438/396 |
| 2009/0259902 A1* | 10/2009 | Tahata | H01L 21/823456 714/728 |
| 2011/0147765 A1* | 6/2011 | Huang | H01L 21/28123 257/77 |
| 2013/0009250 A1* | 1/2013 | Lee | H01L 21/82384 257/369 |

FOREIGN PATENT DOCUMENTS

| | | |
|---|---|---|
| JP | 2008118004 A | 5/2008 |
| WO | 2011043284 A1 | 4/2011 |

* cited by examiner

*Primary Examiner* — Daniel D Chang
(74) *Attorney, Agent, or Firm* — Kim & Stewart LLP

(57) ABSTRACT

A semiconductor device includes first, second and third semiconductor regions, each surrounded by an element isolation layer, first and second transistors of the first semiconductor region connected in parallel between first and second nodes, a third transistor of the second semiconductor region between the second node and the first transistor, and a fourth transistor of the third semiconductor region between the second node and the second transistor. Gates of the first and second transistors extend in a first direction and are spaced from each other in a second direction. A first distance which is equal to a longer of two distances between the element isolation layer and the gate electrode of the first transistor in the second direction, is greater than a second distance which is equal to a longer of two distances between the element isolation layer and the gate electrode of the third transistor in the second direction.

20 Claims, 22 Drawing Sheets

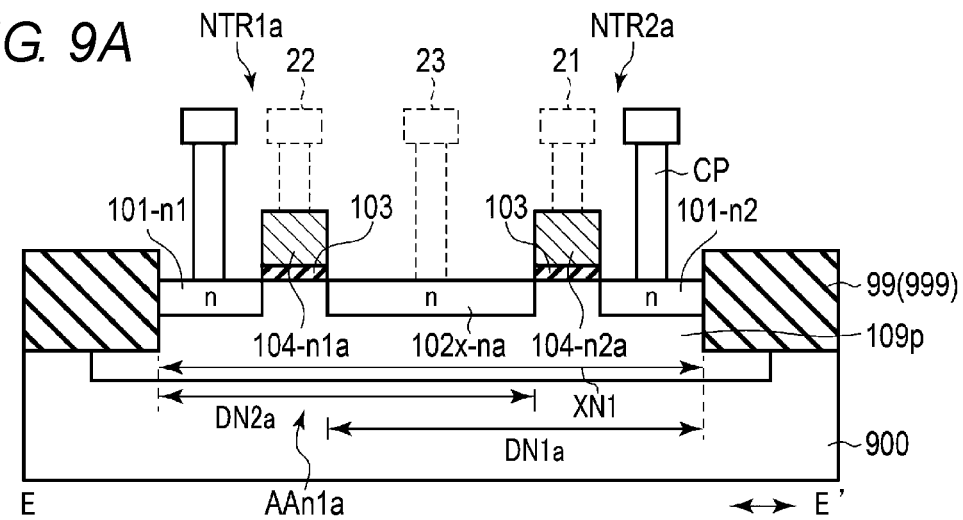
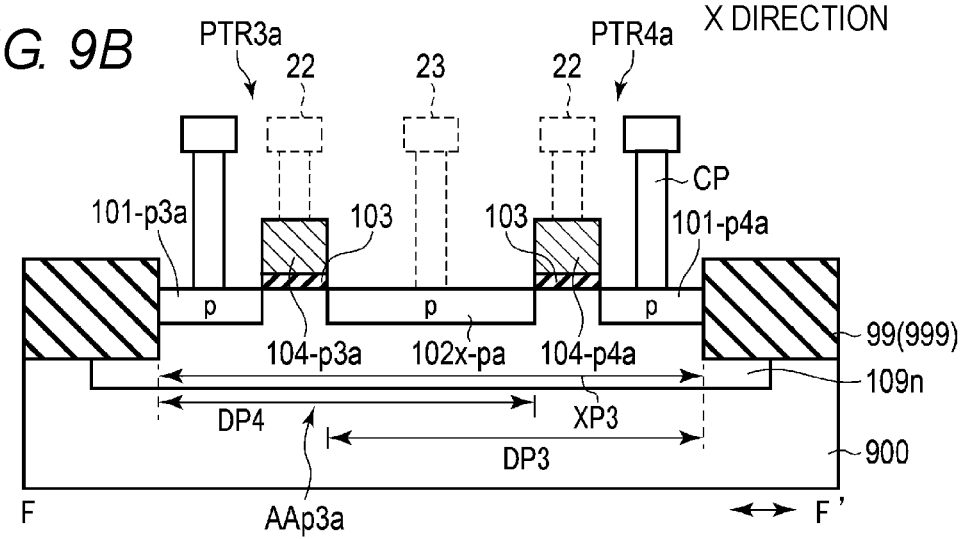
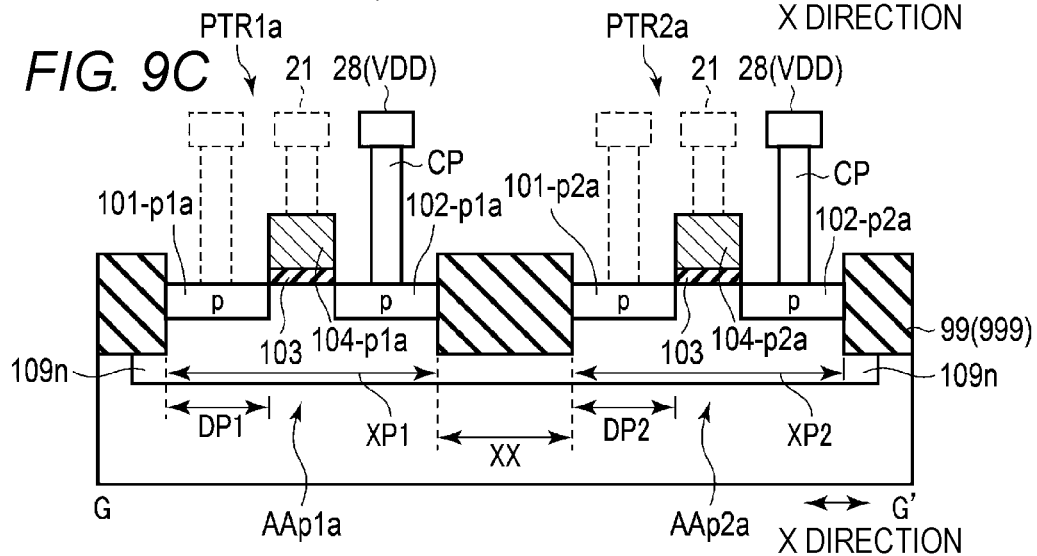

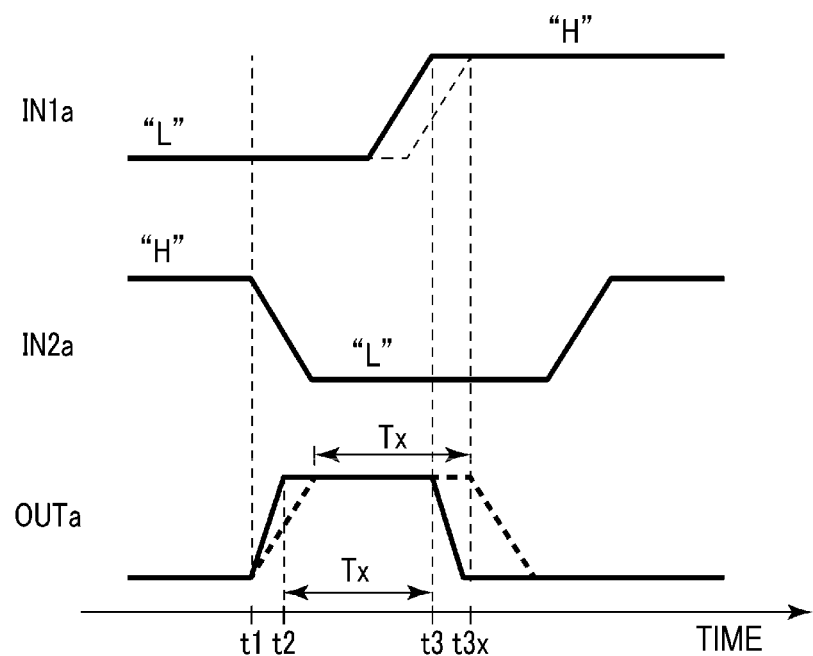

SEMICONDUCTOR DEVICE

CROSS-REFERENCE TO RELATED APPLICATIONS

This application is based upon and claims the benefit of priority from Japanese Patent Application No. 2018-171996, filed Sep. 14, 2018, the entire contents of which are incorporated herein by reference.

FIELD

Embodiments described herein relate generally to a semiconductor device.

BACKGROUND

The performance of a semiconductor device that includes a plurality of field effect transistors depends on characteristics of the field effect transistors.

DESCRIPTION OF THE DRAWINGS

FIGS. 9A to 9C are cross-sectional views illustrating the first application example of the semiconductor device of the embodiment.

FIG. 10 is a timing diagram illustrating changes in performance in the first application example of the semiconductor device of the embodiment.

DETAILED DESCRIPTION

Figure 1:
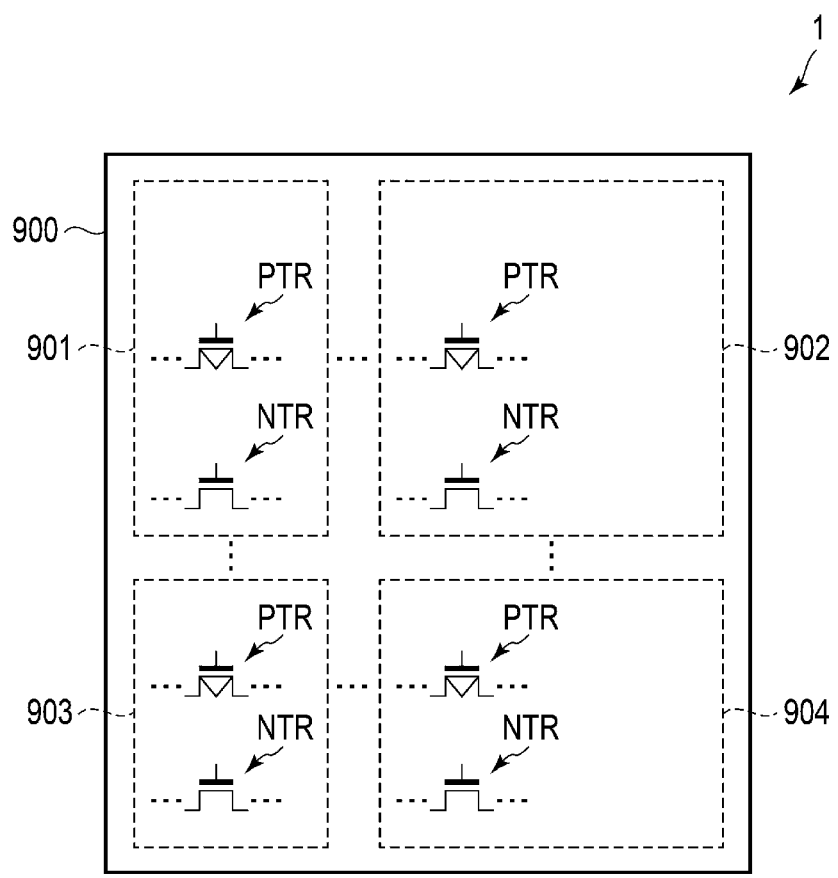
FIG. 1 is a schematic view illustrating a semiconductor device of an embodiment.

Embodiments provide a semiconductor device having improved performance characteristics.

In general, according to one embodiment, a semiconductor device includes first and second nodes, first, second and third semiconductor regions, each of which is surrounded by an element isolation layer, first and second transistors of a first conductivity type connected in parallel between the first node and the second node, and provided within the first semiconductor region, a third transistor of the first conductivity type connected between the second node and the first transistor, and provided within the second semiconductor region, and a fourth transistor of the first conductivity type connected between the second node and the second transistor, and provided within the third semiconductor region. Gate electrodes of the first and second transistors extend in a first direction and are spaced from each other in a second direction that is perpendicular to the first direction, and gate electrodes of the third and fourth transistors also extend in the first direction. A first distance which is equal to a longer of two distances between the element isolation layer and the gate electrode of the first transistor in the second direction, is greater than a second distance which is equal to a longer of two distances between the element isolation layer and the gate electrode of the third transistor in the second direction.

Embodiment

Descriptions will be made on a semiconductor device according to an embodiment with reference to FIGS. 1 to 28.

Hereinafter, the embodiment will be described in detail with reference to the drawings. In the following description, elements having the same functions and configurations are given the same reference numerals.

Further, in each embodiment below, with respect to elements having reference numerals to which numerals and/or alphabet letters for distinction are attached at the ends thereof (e.g., reference numerals or the like of transistors, various terminals, various voltages, and signals), when the respective elements do not need to be distinguished from each other, the numerals and/or alphabet letters at the end of the reference numerals are omitted in the description.

(1) Basic Configuration

Descriptions will be made on a basic configuration of a semiconductor device of the embodiment with reference to FIGS. 1 to 5.

FIG. 1 is a schematic view illustrating a semiconductor device of the embodiment.

In FIG. 1, an example of a layout of a semiconductor device chip of the embodiment is illustrated.

A semiconductor device 1 includes one or more circuit blocks (also called macros or circuit cells) 901, 902, 903, and 904 within a chip or a semiconductor substrate 900.

Each of the circuit blocks 901, 902, 903, and 904 is a circuit (an analog circuit or a logic circuit) configured to execute a certain function, a processing and/or an operation. For example, each of the circuit blocks 901, 902, 903, and 904 includes a plurality of field effect transistors NTR and PTR.

The semiconductor device 1 may be any of the following devices: a system LSI, a processor (e.g., a CPU), an image processing circuit (e.g., a GPU), a random access memory (RAM), a read-only memory (ROM), a NAND-type flash memory, an ASIC and the like.

Figure 2:
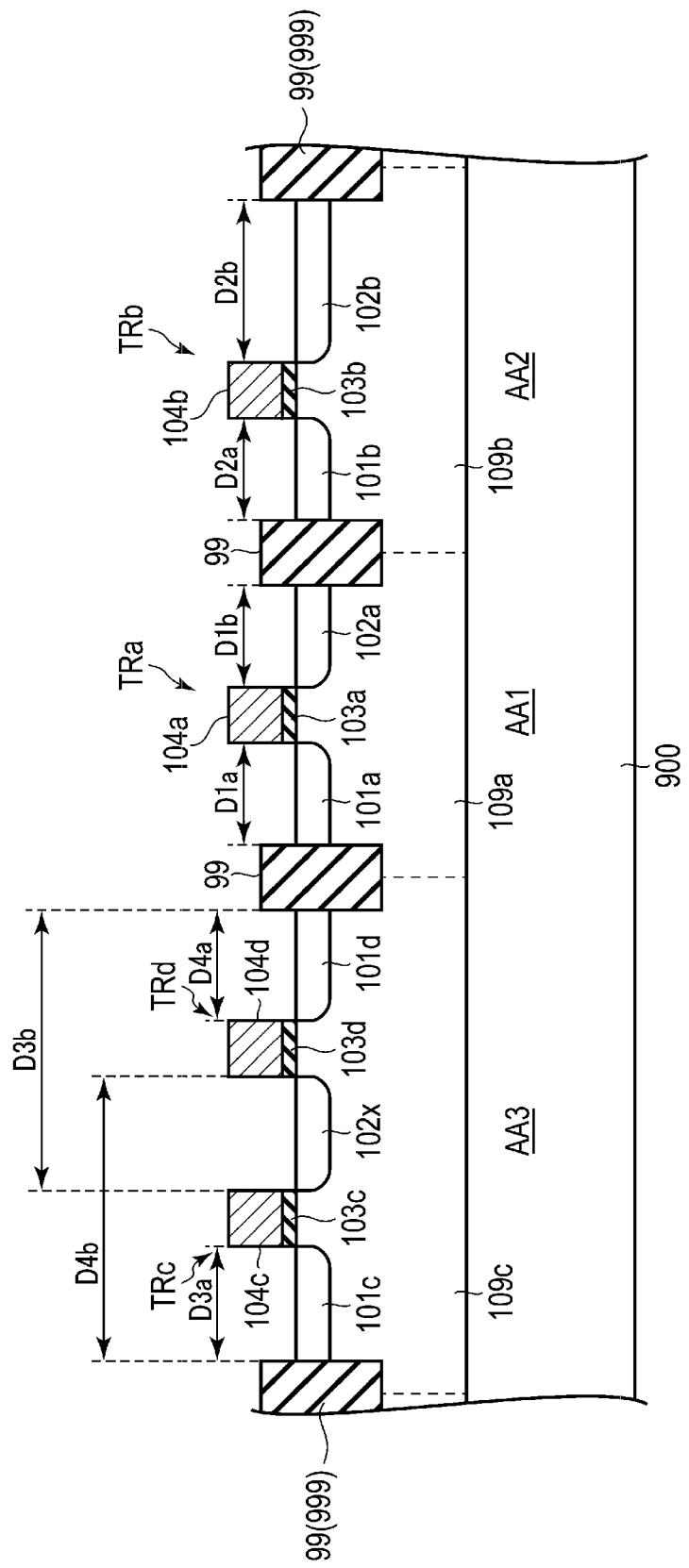
FIG. 2 is a cross-sectional view illustrating the semiconductor device of the embodiment.

FIG. 2 is a schematic sectional view illustrating a part extracted from the semiconductor device of the embodiment.

As illustrated in FIG. 2, a plurality of semiconductor regions (hereinafter, also called active regions) AA1, AA2, and AA3 are disposed in the semiconductor substrate 900.

The semiconductor regions AA1, AA2, and AA3 are electrically isolated from each other by an insulator (hereinafter, also called an element isolation layer) 99 within an element isolation area 999. The semiconductor region AA1 is surrounded by a first element isolation layer. The second semiconductor region AA2 is surrounded by a second element isolation layer. The third semiconductor region AA3 is surrounded by a third element isolation layer. The first, second, and third element isolation layers are contiguous with each other to form one layer.

At least one of field effect transistors (e.g., MOS transistors) TRa, TRb, TRc, and TRd is provided within each of the semiconductor regions AA1, AA2, and AA3. Hereinafter, for simplicity of explanation, the field effect transistor is also called a transistor.

The transistor TRa is provided within the semiconductor region AA1.

The semiconductor region AA1 includes a well region 109a. Two source/drain layers 101a and 102a of the transistor TRa are formed within the well region 109a on the upper surface side of the semiconductor substrate 900. The source/drain layers 101a and 102a are diffusion layers (impurity doped semiconductor layers). Hereinafter, the source/drain layers 101a and 102a are also called source/drain diffusion layers or source/drain regions.

A gate insulating layer 103a is formed on the upper surface of the well region 109a. A gate electrode 104a is provided on the gate insulating layer 103a. A channel region of the transistor TRa is the region between the source/drain layers 101a and 102a. The gate electrode 104a faces the channel region through the gate insulating layer 103a.

In the transistor TRa, wiring (not illustrated) is electrically connected to each of the source/drain diffusion layers 101a and 102a and the gate electrode 104a through a contact plug (not illustrated).

The transistor TRb is provided within the semiconductor region AA2.

Two source/drain layers 101b and 102b of the transistor TRb are formed within a well region 109b of the semiconductor region AA2. A gate electrode 104b is disposed above the well region 109b and on a gate insulating layer 103b. The gate electrode 104b faces a channel region between the two source/drain layers 101b and 102b through the gate insulating layer 103b.

In the transistor TRb, wiring (not illustrated) is electrically connected to each of the source/drain diffusion layers 101b and 102b and the gate electrode 104b through a contact plug (not illustrated).

In the example illustrated herein, two transistors TRc and TRd are provided on one semiconductor region AA3.

A well region 109c is formed within the semiconductor region AA3. A gate electrode 104c of the transistor TRc is provided above the well region 109c and on a gate insulating layer 103c. A gate electrode 104d of the transistor TRd is formed above the well region 109c and on a gate insulating layer 103d. The gate electrode 104d is aligned with the gate electrode 104c in the gate length direction of the transistor.

The transistor TRc has source/drain layers 101c and 102x within the well region 109c. The transistor TRd has source/drain layers 101d and 102x within the well region 109c. The source/drain layer 102x is formed within the well region 109c between the two gate electrodes 104c and 104d. The source/drain layer 102x is shared by the two transistors TRc and TRd.

In the transistors TRc and TRd, wiring (not illustrated) is electrically connected to each of the source/drain diffusion layers 101c, 101d, and 102x and the gate electrodes 104c and 104d through a contact plug (not illustrated).

Depending on whether the transistor TR (TRa, TRb, TRc, and TRd) is an N-type transistor NTR or a P-type transistor PTR, a conductivity type of the well region 109 (109a, 109b, and 109c), a conductivity type of the source/drain diffusion layers 101 and 102 (101a, 101b, 101c, 101d, 102a, 102b, and 102x), and a material of the gate electrode 104 (104a, 104b, 104c, and 104d) are properly selected.

Characteristics of the field effect transistor TR may be changed according to the relationship between the element isolation layer 99 and the gate electrode 104.

For example, a threshold voltage of a field effect transistor may be changed according to a distance between the element isolation layer 99 and the gate electrode 104 in the gate length direction of the transistor (e.g., a length of a source/drain diffusion layer). In the embodiment, a change in a threshold voltage based on the distance between the element isolation layer 99 and the gate electrode 104 in the gate length direction is called an LOD (Length of Diffusion) effect.

In the embodiment, a distance D between end portions of an element isolation layer and a gate electrode in the gate length direction of the transistor is used as a value for determining (evaluating) the influence of the LOD effect. Hereinafter, a distance for evaluating the LOD effect is called an LOD value.

In the transistor TRa, a distance D1a in the gate length direction between one end of the gate electrode 104a and the element isolation insulating layer 99 is substantially the same as a distance D1*b* in the gate length direction between the other end of the gate electrode 104*a* and the element isolation insulating layer 99. In this case, the LOD value of the transistor TRa is substantially the same between the value D1*a* and the value D1*b*.

In the layout of the transistor on the semiconductor region, as in the transistor TRb in FIG. 2, when a distance D2*a* in the gate length direction on one end side of the gate electrode 104*b* is different from a distance D2*b* in the gate length direction on the other end side of the gate electrode 104*b*, the characteristics (e.g., the threshold voltage) of the transistor TRb depend on the larger distance D2*b*, of the two different distances D2*a* and D2*b*.

In another example, as in the transistors TRc and TRd within the semiconductor region AA3, when a plurality of transistors are provided in one semiconductor region, a larger of distance between the element isolation layer 99 and one end side of the gate electrode 104 in the gate length direction of a certain transistor and a distance between the element isolation layer 99 and the other end side of the gate electrode 104 is the distance on the side across a gate electrode of another transistor.

In this case, in the certain transistor TRc, of the distances D3*a* and D3*b* between the gate electrode and the element isolation insulating layer, the larger distance D3*b* serves as the LOD value that affects the characteristics of an MOS transistor. Likewise, in the transistor TRd, the larger distance D4*b* of two distances D4*a* and D4*b* is used as the LOD value.

Figure 3:
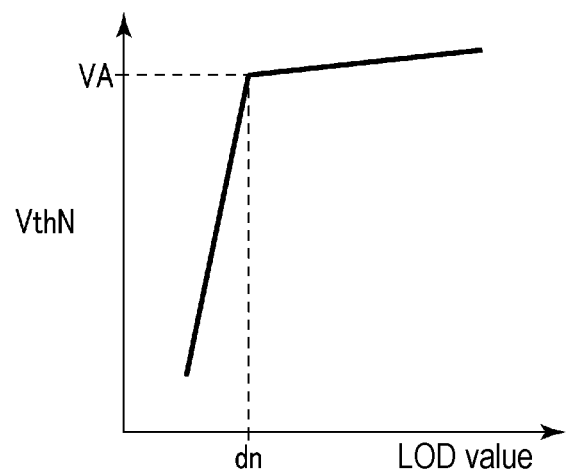
FIG. 3 is a graph illustrating a performance characteristic of one type of transistor in the semiconductor device of the embodiment.
Figure 4:
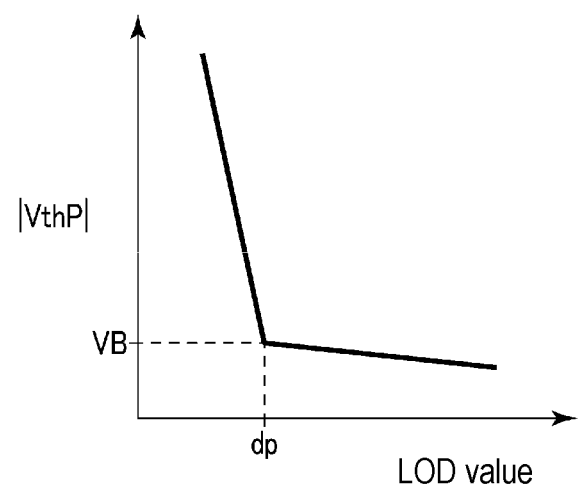
FIG. 4 is a graph illustrating a performance characteristic of another type of transistor in the semiconductor device of the embodiment.

FIGS. 3 and 4 are graphs illustrating the LOD effect on a performance of a field effect transistor.

FIG. 3 is a graph illustrating a change in the threshold voltage of an N-type MOS transistor in relation to the LOD value. In FIG. 3, the horizontal axis of the graph corresponds to the LOD value, and the vertical axis of the graph corresponds to the threshold voltage VthN of the N-type MOS transistor.

As illustrated in FIG. 3, as the LOD value of the N-type MOS transistor increases, the threshold voltage VthN of the N-type MOS transistor rises. There is a tendency that when the LOD value of the N-type MOS transistor exceeds a certain value dn, the threshold voltage of the N-type MOS transistor is saturated. For example, in the N-type MOS transistor, the threshold voltage when the LOD value is the value dn corresponds to a threshold voltage value VA. For example, the value dn is about 0.5 μm.

FIG. 4 is a graph illustrating a change in the threshold voltage of a P-type MOS transistor in relation to the LOD value. In FIG. 4, the horizontal axis of the graph corresponds to the LOD value of the P-type MOS transistor, and the vertical axis of the graph corresponds to the absolute value of the threshold voltage |VthP| of the P-type MOS transistor.

As illustrated in FIG. 4, as the LOD value of the P-type MOS transistor increases, the absolute value of the threshold voltage (|VthP| of the P-type MOS transistor decreases.

There is a tendency that when the LOD value of the P-type MOS transistor exceeds a certain value dp, the threshold voltage VthP of the P-type MOS transistor is saturated. For example, in the P-type MOS transistor, the threshold voltage |VthP| when the LOD value is the value dp corresponds to a threshold voltage value VB. For example, the value dp is about 0.5 μm.

In this manner, due to the LOD effect, the threshold voltage of a transistor may change according to the LOD value (a distance between a gate electrode and an element isolation insulating layer in the gate length direction of the transistor).

Figure 5:
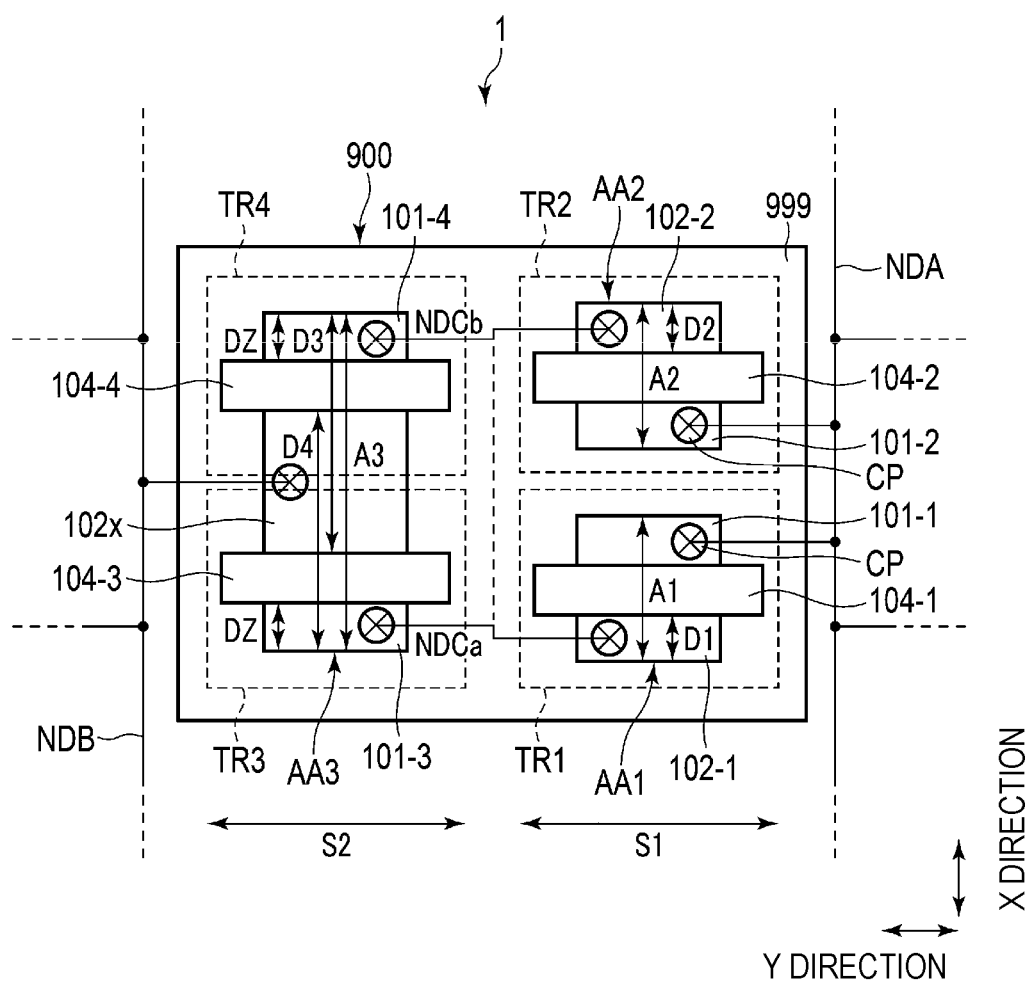
FIG. 5 is a view illustrating a basic example of the semiconductor device of the embodiment.

FIG. 5 is a schematic view illustrating a basic example of the semiconductor device of the embodiment.

As illustrated in FIG. 5, a transistor TR1 is connected between two nodes NDA and NDCa of the semiconductor device 1. One end 101-1 of a current path of the transistor TR1 is connected to the node NDA through a contact plug CP. The other end 102-1 of the current path of the transistor TR1 is connected to the node NDCa through a contact plug CP.

A transistor TR2 is connected between nodes NDA and NDCb. One end 101-2 of a current path of the transistor TR2 is connected to the node NDA through a contact plug CP. The other end 102-2 of the current path of the transistor TR2 is connected to the node NDCb through a contact plug CP.

A transistor TR3 is connected between a node NDB and the node NDCa. One end 101-3 of a current path of the transistor TR3 is connected to the node NDCa. The other end 102*x* of the current path of the transistor TR3 is connected to the node NDB.

A transistor TR4 is connected between the node NDB and the node NDCb. One end 101-4 of a current path of the transistor is connected to the node NDCb. The other end 102*x* of the current path of the transistor TR4 is connected to the node NDB.

For example, a gate 104-1 of the transistor TR1 is connected to a gate 104-2 of the transistor TR2. For example, a gate 104-3 of the transistor TR3 is connected to a gate 104-4 of the transistor TR4.

For example, a voltage of the node NDCa is substantially the same as a voltage of the node NDCb.

Between the node NDA and the node NDB, the current path of the transistor TR1 is electrically connected in series to the current path of the transistor TR3 through the node NDCa. Between the node NDA and the node NDB, the current path of the transistor TR2 is electrically connected in series to the current path of the transistor TR4 through the node NDCb.

Between the node NDA and the node NDB, the current path of the transistor TR1 is connected in parallel to the current path of the transistor TR2. Between the node NDA and the node NDB, the current path of the transistor TR3 is connected in parallel to the current path of the transistor TR4.

The transistor TR1 and the transistor TR2 are provided in a first stage of the circuit between the node NDA and the node NDB. The transistor TR3 and the transistor TR4 are provided in a second stage of the circuit between the node NDA and the node NDB.

In the embodiment, the transistor TR1 is provided within the semiconductor region AA1. The transistor TR2 is provided within the semiconductor region AA2. The semiconductor region AA2 is isolated from the semiconductor region AA1 by an element isolation area. The transistors TR3 and TR4 are provided within the same semiconductor region AA3. For example, the semiconductor region AA1 is adjacent to the semiconductor region AA2 in the X direction (the gate length direction of the transistor). The semiconductor region AA3 is adjacent to the semiconductor regions AA1 and AA2 in the Y direction (the gate width direction of the transistor).

A dimension A2 of the semiconductor region AA2 in the gate length direction (X direction) is substantially the same as a dimension A1 of the semiconductor region AA1 in the gate length direction. A dimension A3 of the semiconductor region AA3 in the gate length direction is larger than the dimension A1 of the semiconductor region AA1 in the gate length direction.

The two transistors TR3 and TR4 connected in parallel are disposed within the same semiconductor region AA3. Accordingly, each of LOD values D3 and D4 of each of the transistors TR3 and TR4 is larger than an LOD value D1 of the transistor TR1. A LOD value D2 of the transistor TR2 is substantially the same as the LOD value D1 of the transistor TR1. For example, a dimension DZ of the transistor TR4 (or the transistor TR3) is substantially the same as the dimension D1 of the transistor TR1 and/or the dimension D2 of the transistor TR2.

In the example illustrated in FIG. 5, N-type transistors are used as the transistors TR1 to TR4 of the semiconductor device 1.

When the N-type transistor is used in the semiconductor device 1 of FIG. 5, the node NDA is set to a node on an output terminal side of the semiconductor device 1, and the node NDB is set to a node on a ground terminal side (a low voltage terminal side) of the semiconductor device 1.

A voltage of the output terminal may take a voltage value between a power supply voltage and a ground voltage according to an output signal. Thus, a voltage of the node NDA as the output terminal may take a voltage equal to or higher than a voltage of the node NDB as the ground terminal. In this case, the voltage of the node NDA has a value that is equal to or relatively higher than the voltage of the node NDB.

As described above with reference to FIG. 3, as the LOD value of the N-type transistor increases, the threshold voltage of the N-type transistor increases.

Thus, the N-type transistors TR3 and TR4 having the large LOD values D3 and D4 are improved in cutoff characteristics. As a result, an off leakage current of each of the N-type transistors TR3 and TR4 decreases. The N-type transistors TR1 and TR2 having the small LOD values D1 and D2 have low threshold voltages. As a result, each of the N-type transistors TR1 and TR2 has a large ON current, and a high ON speed.

For example, in the semiconductor device 1 when the N-type transistors are used, it is desirable that each of the LOD values D1 and D2 in each of the N-type transistors TR1 and TR2 is smaller than the value dn, so that the OFF leakage current can be decreased. It is desirable that each of the LOD values D3 and D4 in each of the N-type transistors TR3 and TR4 is equal to or larger than the value dn, so that the ON speed can be improved.

Accordingly, when the semiconductor device 1 in FIG. 5 is formed by the N-type transistors, the semiconductor device 1 of the embodiment may reduce power consumption, and may achieve a high-speed operation.

In the semiconductor device of the embodiment in FIG. 5, for example, P-type transistors may be used as the transistors TR1 to TR4.

When the P-type transistor is used in the semiconductor device 1 of FIG. 5, a node ND1 is set to a node on a power supply terminal side (a high voltage terminal side) of the semiconductor device 1, and a node ND2 is set to a node on an output terminal side of the semiconductor device 1. In this case, a voltage of the node ND2 as the output terminal may take a voltage equal to or lower than a voltage of the node ND1 as the power supply terminal. In this case, the voltage of the node ND2 has a value that is equal to or relatively lower than the voltage of the node ND1.

As described above with reference to FIG. 4, as the LOD value of the P-type transistor increases, the threshold voltage (the absolute value) of the P-type transistor is lowered.

Thus, the P-type transistors TR1 and TR2 having the small LOD values D1 and D2 are improved in cutoff characteristics. As a result, an off leakage current of each of the P-type transistors TR1 and TR2 decreases.

Each of the P-type transistors having the large LOD values D3 and D4 has a low threshold voltage (a threshold voltage having a small absolute value). As a result, an ON current of each of the transistors TR3 and TR4 increases, and an ON speed of each of the transistors TR3 and TR4 is improved. This improves the operating speed of the semiconductor device.

For example, in the semiconductor device 1 when the P-type transistors are used, it is desirable that each of the LOD values in each of the P-type transistors TR1 and TR2 is smaller than the value dp, so that the off leakage current can be decreased. It is desirable that each of the LOD values in each of the P-type transistors TR3 and TR4 is equal to or larger than the value dp, so that the ON speed can be improved.

Accordingly, when the semiconductor device 1 in FIG. 5 is formed by the P-type transistors, the semiconductor device 1 of the embodiment may reduce power consumption, and may achieve a high-speed operation.

In this manner, in the semiconductor device of the embodiment, an adverse effect caused by an LOD effect of a field effect transistor is prevented.

Therefore, in the semiconductor device of the embodiment, the characteristics of the semiconductor device may be improved.

(2) Application Example

Descriptions will be made on an application example of a semiconductor device of the embodiment with reference to FIGS. 6 to 28.

(a) First Example

Descriptions will be made on First Example of the application example of the semiconductor device of the embodiment with reference to FIGS. 6 to 10.

For example, the semiconductor device of the embodiment is applied to a NOR gate.

Circuit Example

Figure 6:
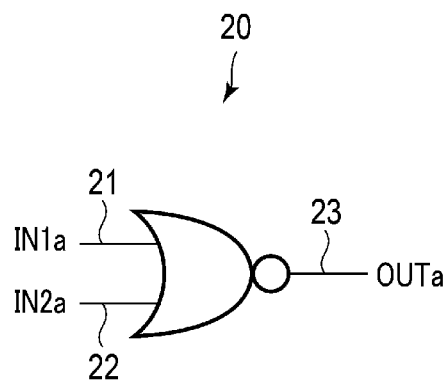
FIG. 6 is a simplified circuit diagram of a first application example of the semiconductor device of the embodiment.

FIG. 6 is a schematic view illustrating a NOR gate as the semiconductor device of the embodiment.

FIG. 6 illustrates a circuit symbol for the NOR gate.

As illustrated in FIG. 6, a NOR gate 20 includes two input terminals 21 and 22 and one output terminal 23. In the NOR gate 20, a signal IN1a is supplied to one input terminal 21. In the NOR gate 20, a signal IN2a is supplied to the other input terminal 22. A result of a NOR operation (negative OR) using the two signals IN1a and IN2a is output as an output signal OUTa of the NOR gate 20, from the output terminal 23.

Figure 7:
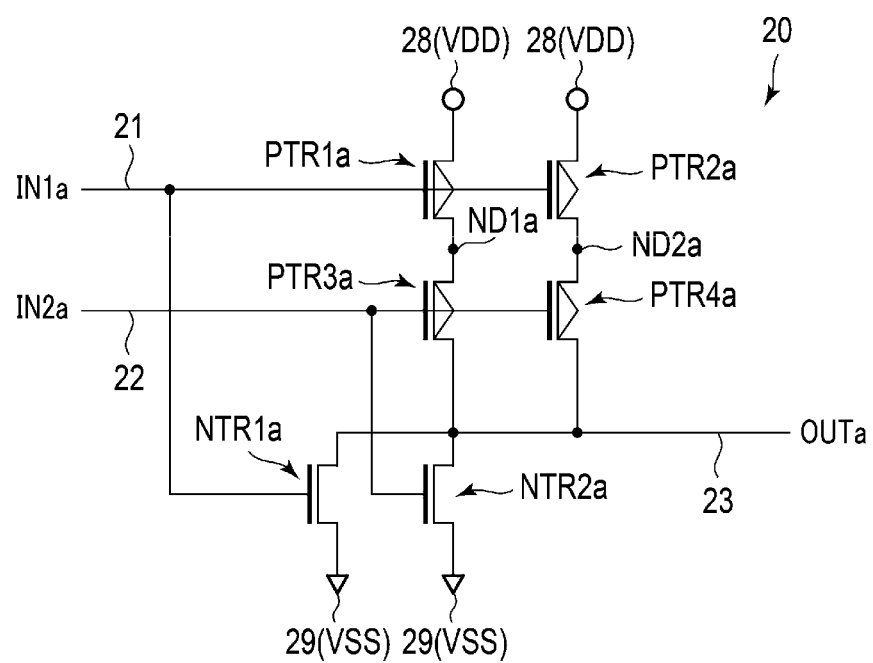
FIG. 7 is a more detailed circuit diagram of the first application example of the semiconductor device of the embodiment.

FIG. 7 is an equivalent circuit diagram of the NOR gate as the semiconductor device of the embodiment.

As illustrated in FIG. 7, the NOR gate 20 includes a plurality of P-type field effect transistors PTR1a, PTR2a, PTR3a, and PTR4a, and a plurality of N-type field effect transistors NTR1a and NTR2a.

The first input terminal 21 of the NOR gate 20 is connected to a gate of the P-type field effect transistor PTR1a and a gate of the P-type field effect transistor PTR2a.

One terminal (one of a source/a drain) of the transistor PTR1a is connected to a terminal (node) 28. The other terminal (the other of a source/a drain) of the transistor PTR1*a* is connected to a node ND1*a*.

A power supply voltage VDD is applied to the terminal 28. Hereinafter, a terminal to which the power supply voltage VDD is applied is called a power supply terminal.

One terminal of the transistor PTR2*a* is connected to the power supply terminal 28. The other terminal of the transistor PTR2*a* is connected to a node ND2*a*.

The second input terminal 22 of the NOR gate 20 is connected to a gate of the P-type field effect transistor PTR3*a* and a gate of the P-type field effect transistor PTR4*a*.

One terminal of the transistor PTR3*a* is connected to the node ND1*a*. The other terminal of the transistor PTR3*a* is connected to the output terminal 23.

One terminal of the transistor PTR4*a* is connected to the node ND2*a*. The other terminal of the transistor PTR4*a* is connected to the output terminal 23.

A gate of the N-type field effect transistor NTR1*a* is connected to the input terminal 21. One terminal of the transistor NTR1*a* is connected to a terminal 29. The other terminal of the transistor NTR1*a* is connected to the output terminal 23. A ground voltage VSS is applied to the terminal 29. Hereinafter, a terminal to which the ground voltage VSS is applied is called a ground terminal.

A gate of the N-type field effect transistor NTR2*a* is connected to the input terminal 22. One terminal of the transistor NTR2*a* is connected to the ground terminal 29. The other terminal of the transistor NTR2*a* is connected to the output terminal 23.

At the first stage on the power supply terminal side, current paths of the two transistors PTR1*a* and PTR2*a* are connected in parallel between the power supply terminal 28 and the output terminal 23.

At the second stage on the output terminal side, current paths of the two transistors PTR3*a* and PTR4*a* are connected in parallel between the power supply terminal 28 and the output terminal 23.

The signals IN1*a* and IN2*a* are supplied to the input terminals 21 and 22. According to signal levels of the signals IN1*a* and IN2*a*, the P-type transistors PTR1*a*, PTR2*a*, PTR3*a*, and PTR4*a* and the N-type transistors NTR1*a* and NTR2*a* are turned ON or OFF. As a result, a NOR operation result of the signals IN1*a* and IN2*a* is output from the output terminal 23.

Structural Example

Figure 8:
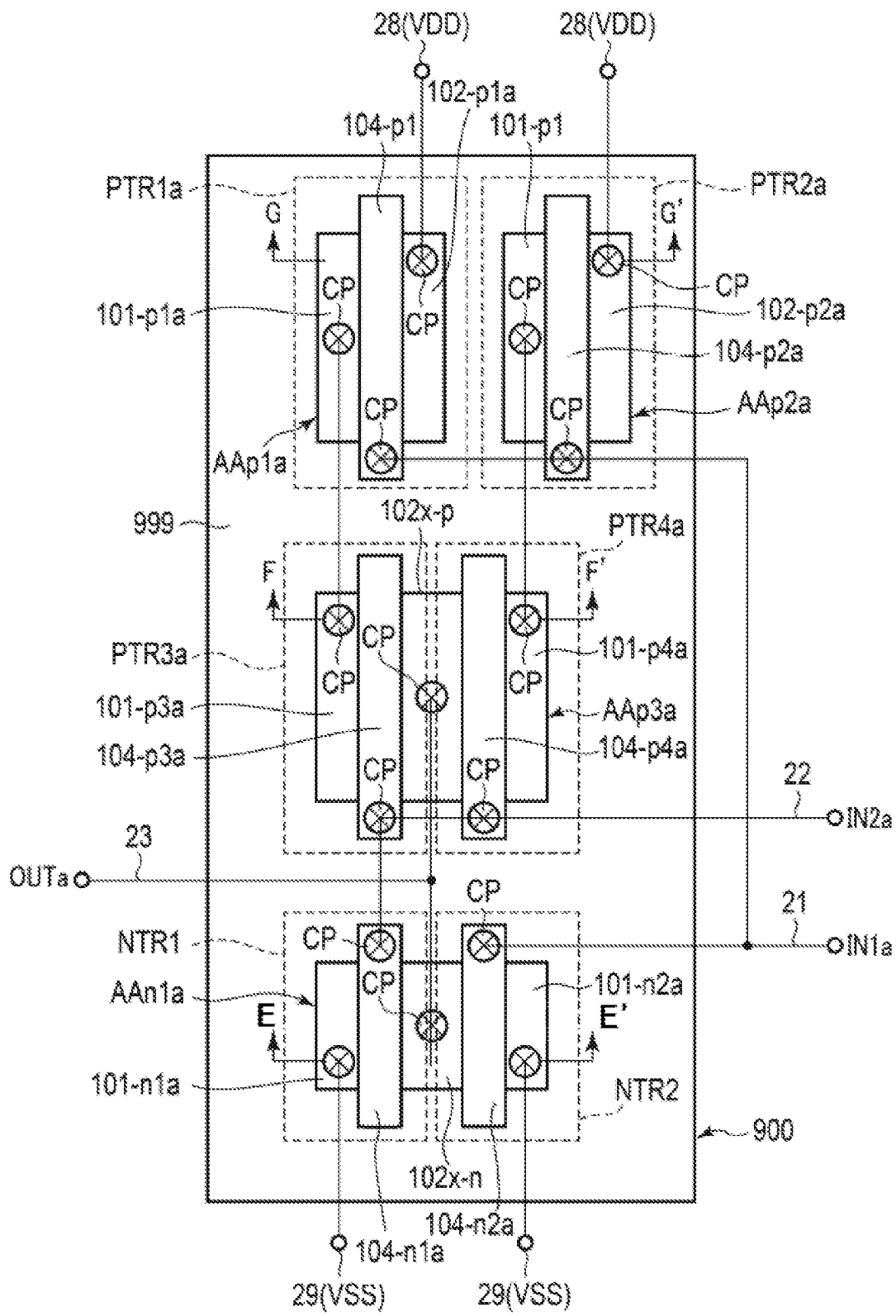
FIG. 8 is a plan view illustrating the first application example of the semiconductor device of the embodiment.

FIG. 8 is a plan view illustrating a layout of the NOR gate of the application example of the semiconductor device of the embodiment. FIGS. 9A to 9C are views schematically illustrating a sectional structure of transistors that make up the NOR gate of the application example of the semiconductor device of the embodiment. FIG. 9A is a section taken along E-E' line of FIG. 8. FIG. 9B is a section taken along F-F' line of FIG. 8. FIG. 9C is a section taken along G-G' line of FIG. 8.

As illustrated in FIG. 8, a plurality of semiconductor regions AA (AAn1*a*, AAp1*a*, AAp2*a*, and AAp3*a*) are formed within the semiconductor substrate 900. The semiconductor regions (also called active regions) AAn1*a*, AAp1*a*, AAp2*a*, and AAp3*a* are electrically isolated from each other by the element isolation area 999. The field effect transistors NTR and PTR are provided within the semiconductor regions AA.

As illustrated in FIG. 8 and FIG. 9A, two N-type field effect transistors NTR1*a* and NTR2*a* are provided within one semiconductor region AAn1*a*. The semiconductor region AAn1*a* has a length XN1 in the X direction (in the gate length direction of the transistor).

A gate electrode 104-*n*1*a* of the transistor NTR1*a* is arranged on a P-type well region 109*p* of the semiconductor region AAn1*a*, through the gate insulating film 103.

A gate electrode 104-*n*2*a* of the transistor NTR2*a* is disposed on the well region 109*p* of the semiconductor region AAn1*a*, through the gate insulating film 103.

The two transistors NTR1*a* and NTR2*a* share a source/drain diffusion layer (which is an N-type semiconductor layer) 102*x*-*n*. The source/drain diffusion layer 102*x*-*n* is formed within the semiconductor region AAn1*a* between the two gate electrodes 104-*n*1*a* and 104-*n*2*a* in parallel in the X direction.

A source/drain diffusion layer 101-*n*1*a* of the transistor NTR1*a* is formed within the semiconductor region AAn1*a* (in particular, within the well region 109*p*) on one end side of the semiconductor region AAn1*a* in the x direction. A source/drain diffusion layer 101-*n*2*a* of the transistor NTR2*a* is formed within the semiconductor region AAn1*a* on the other end side of the semiconductor region AAn1*a* in the x direction.

A contact plug CP is provided on each of the gate electrodes 104-*n*1*a* and 104-*n*2*a* and the source/drain diffusion layers 101-*n*1*a*, 101-*n*2*a*, and 102*x*-*na*.

As described above, as in the case where a plurality of transistors are provided on one semiconductor region, when a distance between a gate electrode and an element isolation area on one end side of a transistor is different from a distance between the gate electrode and an element isolation area on the other end side of the transistor, a threshold voltage of the transistor changes according to the larger value of the two LOD values.

The N-type transistor NTR1*a* has, for example, an LOD value DN1*a*. The N-type transistor NTR2*a* has, for example, an LOD value DN2*a*. The LOD value DN2*a* is substantially the same as the LOD value DN1*a*.

As illustrated in FIG. 8 and FIG. 9B, two P-type field effect transistors PTR3*a* and PTR4*a* are provided within one semiconductor region AAp3*a*. The semiconductor region AAp3*a* has a length XP3 in the X direction.

A gate electrode 104-*p*3*a* of the transistor PTR3*a* is disposed on an N-type well region 109*n* of the semiconductor region AAp3*a* through the gate insulating film 103.

A gate electrode 104-*p*4*a* of the transistor PTR4*a* is disposed on the well region 109*n* of the semiconductor region AAp3*a* through the gate insulating film 103.

The two transistors PTR3*a* and PTR4*a* share a source/drain diffusion layer (which is a P-type semiconductor layer) 102*x*-*pa*. The source/drain diffusion layer 102*x*-*pa* is formed within the semiconductor region AAp3*a* (in particular, within the well region 109*n*), between the two gate electrodes 104-*p*3*a* and 104-*p*4*a* in parallel in the X direction.

A source/drain diffusion layer 101-*p*3*a* of the transistor PTR3*a* is formed within the semiconductor region AAp3*a* on one end side of the semiconductor region AAp3*a* in the X direction. A source/drain diffusion layer 101-*p*4*a* of the transistor PTR4*a* is formed within the semiconductor region AAp3*a* on the other end side of the semiconductor region AAp3*a* in the X direction.

A contact plug CP is provided on each of the gate electrodes 104-*p*3*a* and 104-*p*4*a* and the source/drain diffusion layers 101-*p*3*a*, 101-*p*4*a*, and 102*x*-*pa*.

The P-type transistor PTR3*a* has, for example, an LOD value DP3. The P-type transistor PTR4*a* has, for example, an LOD value DP4. The LOD value DP4 is substantially the same as the LOD value DP3.

As illustrated in FIG. 8 and FIG. 9C, the P-type field effect transistor PTR1a is disposed between the P-type transistor PTR3a and the power supply terminal 28. The P-type field effect transistor PTR2a is connected between the P-type transistor PTR4a and the power supply terminal 28.

These two transistors PTR1a and PTR2a are provided within respective semiconductor regions AAp1a and AAp2a.

The transistor PTR1a is provided within the semiconductor region AAp1a surrounded by the element isolation area 999. The transistor PTR2a is provided within the semiconductor region AAp2a surrounded by the element isolation area 999. The semiconductor region AAp2a is isolated from the semiconductor region AAp1a by an insulating layer within the element isolation area 999.

For example, a distance (a dimension of the element isolation insulating layer) XX between the two semiconductor regions AAp1a and AAp2a is set to be equal to or larger than a gate length of a transistor PTR, and to be equal to or smaller than twice the gate length of the transistor PTR.

A dimension XP1 of the semiconductor region AAp1a in the X direction (in the gate length direction of the transistor) is smaller than the dimension XP3 of the semiconductor region AAp3a in the X direction. A dimension XP2 of the semiconductor region AAp2a in the X direction is substantially the same as the dimension XP1 of the semiconductor region AAp1a. In one example, the dimension XP3 is smaller than twice the dimension XP1.

A dimension of a semiconductor region of a P-type transistor in the channel width direction of the transistor is larger than a dimension of a semiconductor region of an N-type transistor in the channel width direction of the transistor.

A gate electrode 104-p1a of the transistor PTR1a is provided on the well region 109n of the semiconductor region AAp1a through the gate insulating film 103. Two source/drain diffusion layers 101-p1a and 102-p1a of the transistor PTR1a are formed within the semiconductor region AAp1a (in particular, within the well region 109n).

The source/drain diffusion layer 101-p1a of the transistor PTR1a is connected to the source/drain diffusion layer 101-p3a of the transistor PTR3a through a contact plug CP and wiring.

The source/drain diffusion layer 102-p1a of the transistor PTR1a is connected to the power supply terminal (wiring) 28 through a contact plug CP.

A gate electrode 104-p2a of the transistor PTR2a is provided on the well region 109n of the semiconductor region AAp2a through the gate insulating film 103.

Two source/drain diffusion layers 101-p2a and 102-p2a of the transistor PTR2a are formed within the semiconductor region AAp2a.

The source/drain diffusion layer 101-p2a of the transistor PTR2a is connected to the source/drain diffusion layer 101-p4a of the transistor PTR3a through a contact plug CP and wiring.

The source/drain diffusion layer 102-p2a of the transistor PTR2a is connected to the power supply terminal (wiring) 28 through a contact plug CP.

The field effect transistors PTR3a and PTR4a connected to the output terminal 23 are connected to the power supply terminal 28 through the plurality (here, two) of P-type field effect transistors PTR1a and PTR2a connected in parallel.

The P-type transistor PTR1a has, for example, an LOD value DP1. The P-type transistor PTR2a has, for example, an LOD value DP2. The LOD value DP2 is substantially the same as the LOD value DP1.

As illustrated in FIG. 8 and FIGS. 9A to 9C, in the NOR gate in which the P-type transistors between the power supply terminal 28 and the output terminal 23 are disposed such that the P-type transistors are divided into a plurality of stages (also referred to herein as sections), the first stage including the P-type transistors PTR1a and PTR2a that are directly connected to the power supply terminal 28. The two P-type transistors PTR1a and PTR2a are disposed on the respective semiconductor regions AAp1a and AAp2a. These two P-type transistors PTR1a and PTR2a are connected in parallel between the power supply terminal 28 and the output terminal 23.

The second stage includes the P-type transistors PTR3a and PTR4a that are directly connected to the output terminal 23. The two P-type transistors PTR3a and PTR4a are provided within the common semiconductor region AAp3a. These two P-type transistors PTR3a and PTR4a are connected in parallel between the power supply terminal 28 and the output terminal 23.

Accordingly, in the semiconductor device 20 according to the application example, in the two P-type transistors provided within the common semiconductor region AAp3a, a relatively large LOD value may be secured, and in each P-type transistor provided within one semiconductor region AAp1a or AAp2a, a relatively small LOD value may be secured.

FIG. 10 is a view illustrating input/output characteristics of the NOR gate of the present application example. FIG. 10 also illustrates in broken lines input/output characteristics of a conventional NOR gate, as a Comparative Example.

In one example application, an output signal of the NOR gate controls an active state and an inactive state (a stand-by state) of a circuit connected to the output terminal of the NOR gate. In this example, when the output signal OUTa of the NOR gate 20 is an "H" level signal, the circuit is set to an active state. When the output signal OUTa of the NOR gate 20 is an "L" level signal, the circuit is set to a stand-by state. A voltage value corresponding to the "H" level or the "L" level is set based on a transistor having a large threshold voltage.

In the NOR gate, when at least one of the two input signals IN1a and IN2a has an "H" level, the NOR gate outputs an "L" level signal.

When the connected circuit is in a stand-by state, at least one of the P-type transistors PTR1a and PTR2a of the NOR gate 20 is set to an OFF state. Because the threshold voltages of the P-type transistors PTR1a and PTR2a increase due to the LOD effect, off leakage currents of the P-type transistors PTR1a and PTR2a are reduced. As a result, power consumption of the NOR gate 20 is reduced.

For example, in a state where a signal level of the signal IN1a is set to an "L" level, a signal level of the signal IN2a is changed from an "H" level to an "L" level. Accordingly, a signal level of the output signal OUTa is changed from an "L" level to an "H" level.

As described above, as threshold voltages of the P-type transistors are reduced due to the LOD effect, switching speeds of the transistors PTR3a and PTR4a increase, and ON currents of the transistors PTR3a and PTR4a increase. As a result, a rising and falling period of a signal level of the output signal OUTa in the NOR gate 20 of this example is shorter than a rising and falling period of a signal level of the output signal in the conventional NOR gate.

As illustrated in FIG. 10, when a period during which the signal OUTa is kept at an "H" level is set as "Tx," in the NOR gate 20 of the present application example, a transition period of the signal level of the output signal OUTa may be short as compared to that in the conventional NOR gate.

In this manner, the NOR gate of the present application example may operate at a high speed. Accordingly, a circuit controlled by an output signal of the NOR gate may also be set to an active state or a stand-by state in a relatively short time.

As described above, the characteristics of the NOR gate of the present application example may be improved.

(b) Second Example

Descriptions will be made on Second Example of the application example of the semiconductor device of the embodiment with reference to FIG. 11 to FIGS. 14A to 14C.

For example, the semiconductor device of the embodiment is applied to a NAND gate.

Circuit Example

Figure 11:
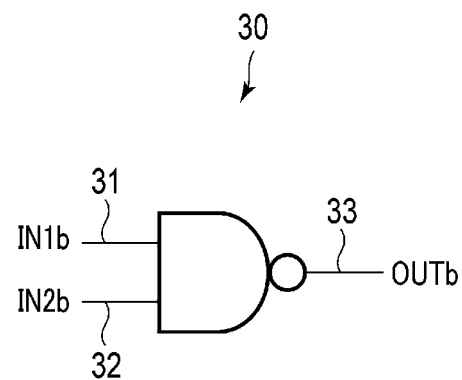
FIG. 11 is a simplified circuit diagram of a second application example of the semiconductor device of the embodiment.

FIG. 11 illustrates a circuit symbol for the NAND gate.

As illustrated in FIG. 11, the NAND gate 30 includes two input terminals 31 and 32, and one output terminal 33. In the NAND gate 30, a signal IN1b is supplied to one input terminal 31. In the NAND gate 30, a signal IN2b is supplied to an input terminal 32. A result of a NAND operation (negative AND) using the two signals IN1b and IN2b is output as an output signal OUTb of the NAND gate 30, from the output terminal 33.

Figure 12:
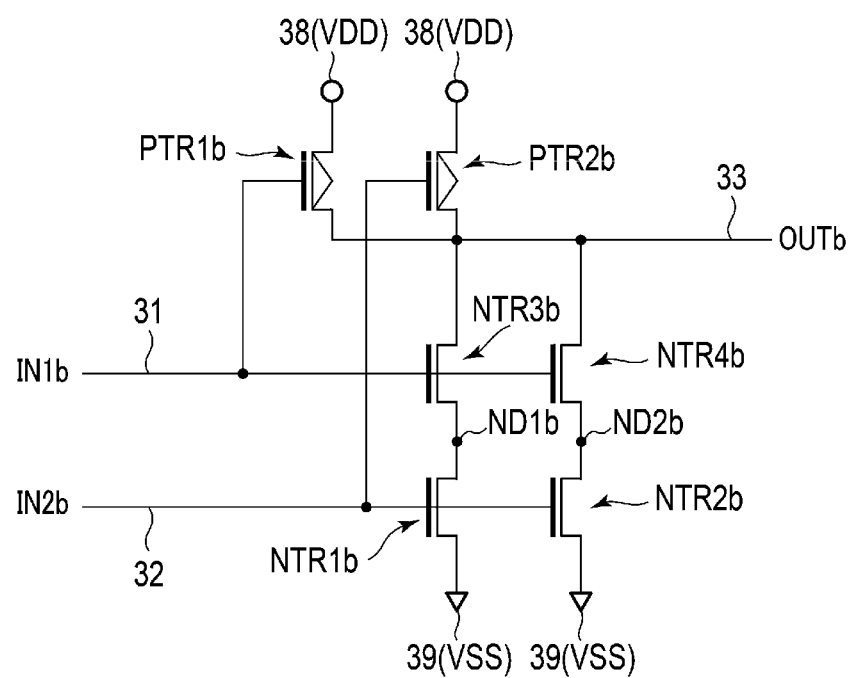
FIG. 12 is a more detailed circuit diagram of the second application example of the semiconductor device of the embodiment.

FIG. 12 is an equivalent circuit diagram of the NAND gate provided as an application example of the semiconductor circuit of the embodiment.

As illustrated in FIG. 12, the NAND gate 30 of the present application example includes four N-type field effect transistors NTR1b, NTR2b, NTR3b, and NTR4b, and two P-type field effect transistors PTR1b and PTR2b.

One input terminal 31 of the NAND gate 30 is connected to gates of the N-type transistors NTR3b and NTR4b, and a gate of the P-type transistor PTR1b.

The other input terminal 32 of the NAND gate 30 is connected to gates of the N-type transistors NTR1b and NTR2b, and a gate of the P-type transistor PTR2b.

One terminal of the transistor PTR1b is connected to a power supply terminal 38. The other terminal of the transistor PTR1b is connected to the output terminal 33.

One terminal of the transistor PTR2b is connected to the power supply terminal 38. The other terminal of the transistor PTR2b is connected to the output terminal 33.

One terminal of the transistor NTR1b is connected to a ground terminal 39. The other terminal of the transistor NTR1b is connected to a node ND1b.

One terminal of the transistor NTR2b is connected to the ground terminal 39. The other terminal of the transistor NTR2b is connected to a node ND2b.

One terminal of the transistor NTR3b is connected to the node ND1b. The other terminal of the transistor NTR3b is connected to the output terminal 33.

One terminal of the transistor NTR4b is connected to the node ND2b. The other terminal of the transistor NTR4b is connected to the output terminal 33.

At the first stage on the ground terminal side, current paths of the two transistors NTR1b and NTR2b are connected in parallel between the ground terminal 39 and the output terminal 33.

At the second stage on the output terminal side, current paths of the two transistors NTR3b and NTR4b are connected in parallel between the ground terminal 39 and the output terminal 33.

The signals IN1b and IN2b are supplied to the input terminals 31 and 32. According to signal levels of the signals IN1b and IN2b, the N-type transistors NTR1b, NTR2b, NTR3b, and NTR4b and the P-type transistors PTR1b and PTR2b are turned ON or OFF. As a result, a NAND operation result of the signals IN1b and IN2b is output from the output terminal 33.

Structural Example

Figure 13:
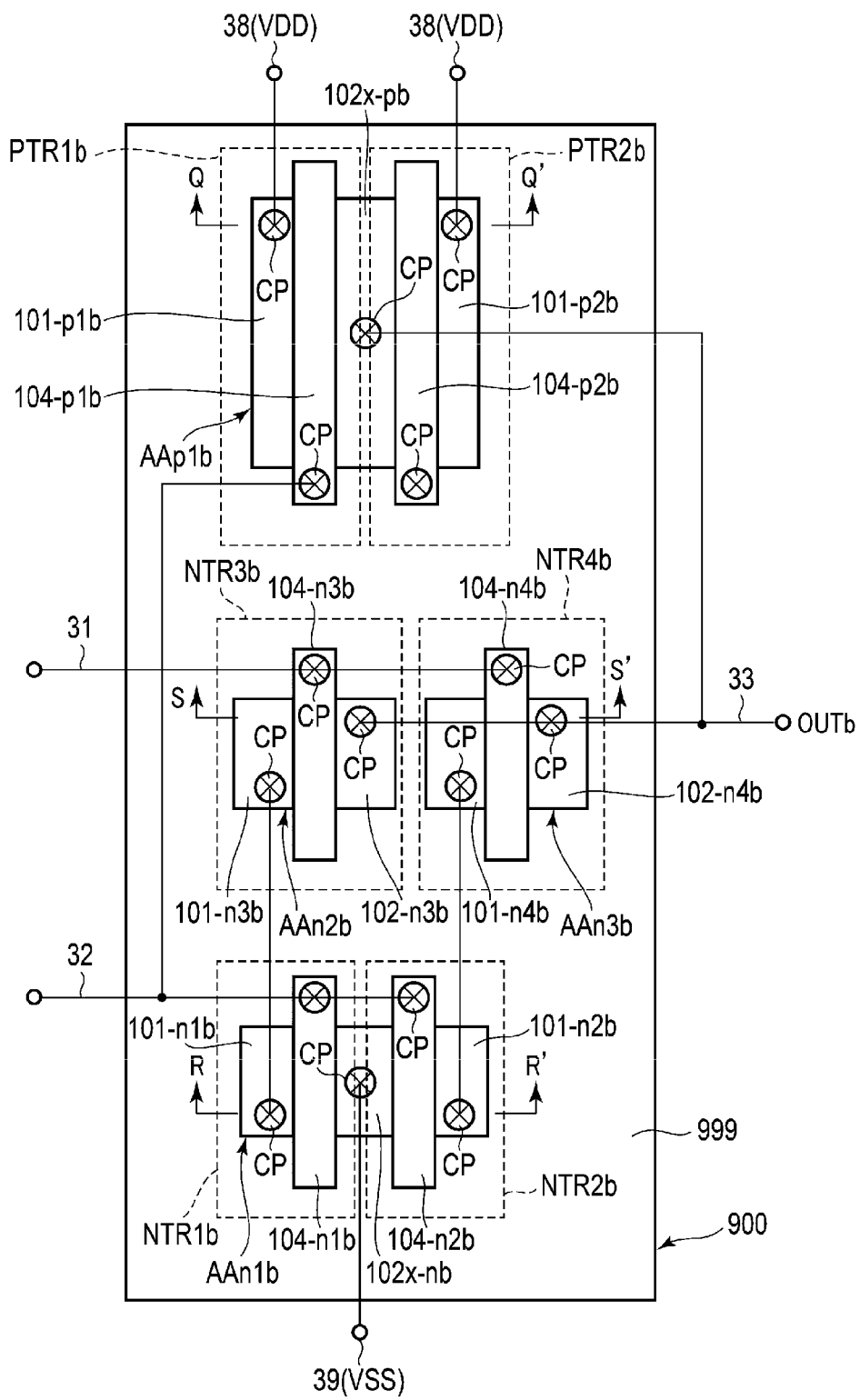
FIG. 13 is a plan view illustrating the second application example of the semiconductor device of the embodiment.
Figure 14A:
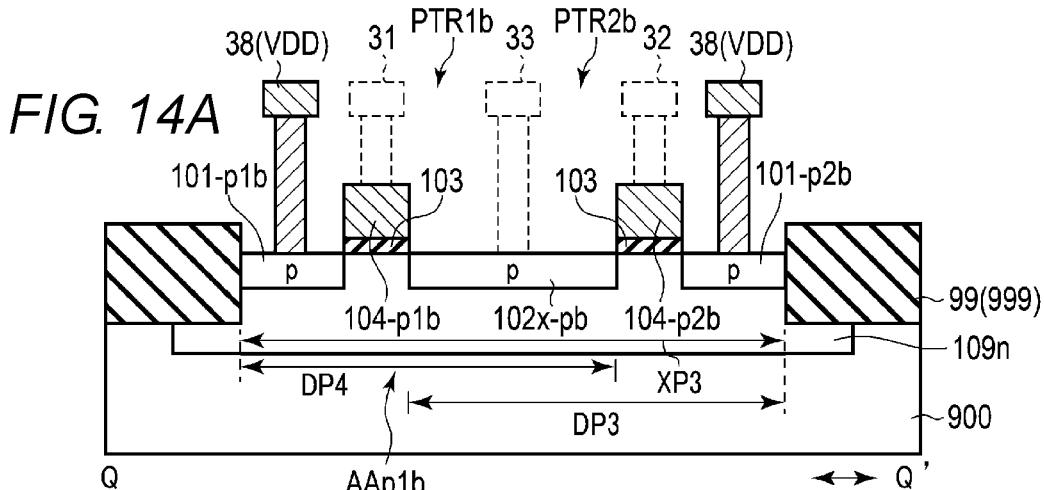
FIGS. 14A to 14C are cross-sectional views illustrating the second application example of the semiconductor device of the embodiment.
Figure 14B:
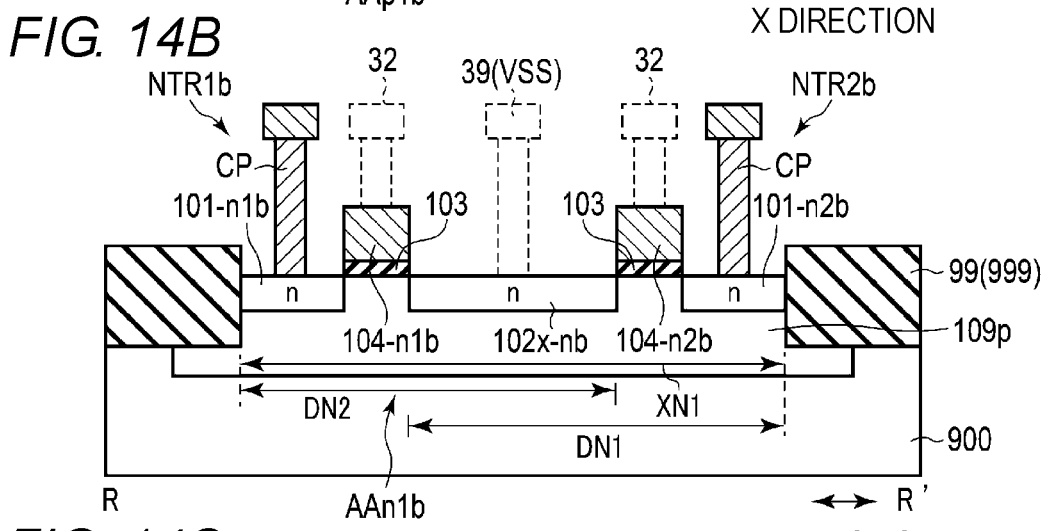
Figure 14C:
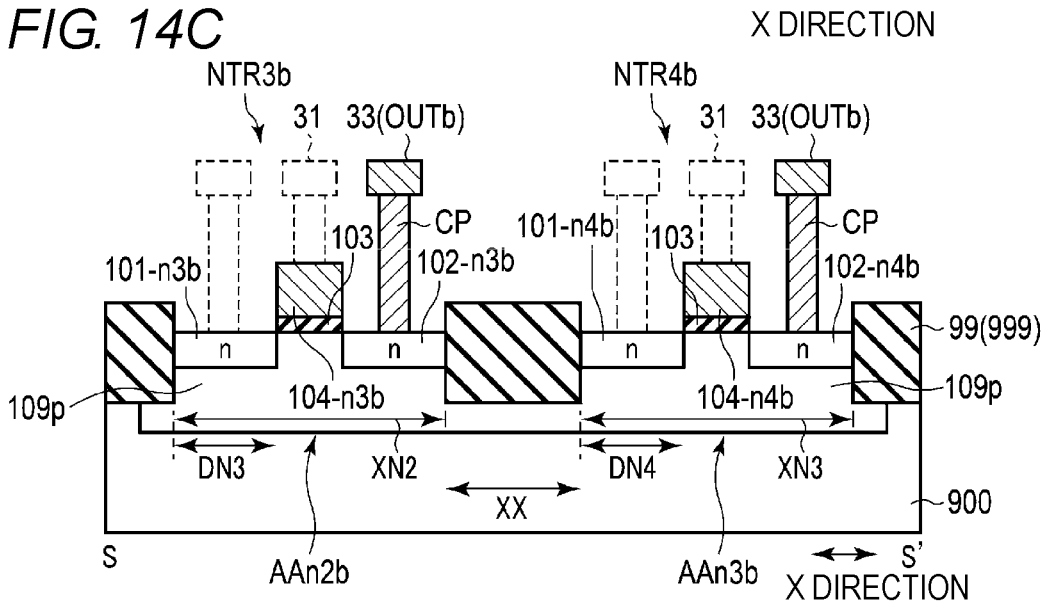

FIG. 13 is a plan view illustrating a layout of the NAND gate of the application example of the semiconductor device of the embodiment. FIGS. 14A to 14C are views schematically illustrating a sectional structure of transistors that make up the NAND gate of the application example of the semiconductor device of the embodiment. FIG. 14A is a sectional view taken along Q-Q' line of FIG. 13. FIG. 14B is a sectional view taken along R-R' line of FIG. 13. FIG. 14C is a sectional view taken along S-S' line of FIG. 13.

As illustrated in FIG. 13 and FIGS. 14A to 14C, a plurality of semiconductor regions AA (AAp1b, AAn1b, AAn2b, and AAn3b) are formed.

As illustrated in FIG. 13 and FIG. 14A, two P-type field effect transistors PTR1b and PTR2b are provided within one semiconductor region AAp1b.

A source/drain diffusion layer 102x-pb is formed within the semiconductor region AAp1b between two gate electrodes 104-p1b and 104-p2b. The two transistors PTR1b and PTR2b share the source/drain diffusion layer 102x-pb. The source/drain diffusion layer 102x-pb is connected to the output terminal 33.

In the transistor PTR1b, a source/drain diffusion layer 101-p1b is connected to the power supply terminal 38 through a contact CP. The gate electrode 104-p1b is connected to the input terminal 31 through a contact.

In the transistor PTR2b, a source/drain diffusion layer 101-p2b is connected to the power supply terminal 38 through a contact CP. The gate electrode 104-p2b is connected to the input terminal 32 through a contact.

As illustrated in FIG. 13 and FIG. 14B, two N-type field effect transistors NTR1b and NTR2b are provided within one semiconductor region AAn1b. The semiconductor region AAn1b has a dimension XN1 in the gate length direction. A source/drain diffusion layer 102x-nb is formed within the semiconductor region AAn1b between two gate electrodes 104-n1b and 104-n2b. The two transistors NTR1b and NTR2b share the source/drain diffusion layer 102x-nb. The source/drain diffusion layer 102x-nb is connected to the ground terminal 39.

In the transistor NTR1b, a source/drain diffusion layer 101-n1b is connected to wiring through a contact CP. The gate electrode 104-n1b is connected to the input terminal 32 through a contact CP.

In the transistor NTR2b, a source/drain diffusion layer 101-n2b is connected to wiring through a contact CP. The gate electrode 104-n2b is connected to the input terminal 32 through a contact CP.

In this manner, the two N-type field effect transistors NTR1b and NTR2b provided within one semiconductor region AAn1b are directly connected to the ground terminal 39.

For example, the transistor NTR1b has an LOD value DN1. An LOD value DN2 of the transistor NTR2b is substantially the same as the LOD value DN1 of the transistor NTR1b. The LOD values DN1 and DN2 are equal to or larger than the value dn.

The two N-type transistors NTR1b and NTR2b are connected in parallel between the ground terminal 39 and the output terminal 33.

As illustrated in FIG. 13 and FIG. 14C, the N-type field effect transistors NTR3b and NTR4b are directly connected to the output terminal 33. The transistors NTR3b and NTR4b are connected to the ground terminal through the transistors NTR1b and NTR2b.

These two transistors NTR3b and NTR4b are provided within respective semiconductor regions AAn2b and AAn3b. The semiconductor region AAn2b is isolated from the semiconductor region AAn3b by the element isolation insulating layer 99.

For example, a distance (a dimension of the element isolation insulating layer) XX between the two semiconductor regions AAn2b and AAn3b is set to be equal to or larger than a gate length of a transistor NTR, and to be equal to or smaller than twice the gate length of the transistor NTR.

The semiconductor region AAn2b has a dimension XN2 in the X direction (in the gate length direction of the transistor). A dimension XN3 of the semiconductor region AAn3b in the X direction is substantially the same as the dimension XN2 of the semiconductor region AAn2b. The dimension XN2 of the semiconductor region AAn2b is smaller than the dimension XN1 of the semiconductor region AAn1b. For example, the dimension XN1 is smaller than twice the dimension XN3.

The transistor NTR3b is provided within the semiconductor region AAn2b.

A gate electrode 104-n3b of the transistor NTR3b is provided on the well region 109p of the semiconductor region AAn2b through the gate insulating film 103. Two source/drain diffusion layers 101-n3b and 102-n3b of the transistor NTR3b are formed within the semiconductor region AAn2b (in particular, within the well region 109p).

The source/drain diffusion layer 101-n3b of the transistor NTR3b is connected to the source/drain diffusion layer 101-n1b of the transistor NTR1b through a contact plug CP and wiring. The source/drain diffusion layer 102-n3b of the transistor NTR3b is connected to the output terminal 33 through a contact plug CP.

The transistor NTR4b is provided within the semiconductor region AAn3b. A gate electrode 104-n4b of the transistor NTR4b is provided on the semiconductor region AAn3b (in particular, the well region 109p) through the gate insulating film 103. Two source/drain diffusion layers 101-n4b and 102-n4b of the transistor NTR4b are formed within the semiconductor region AAn3b (in particular, the well region 109p).

The source/drain diffusion layer 101-n4b of the transistor NTR4b is connected to the source/drain diffusion layer 101-n2b of the transistor NTR2b through a contact plug CP and wiring.

The source/drain diffusion layer 102-n4b of the transistor NTR4b is connected to the output terminal 33 through a contact plug CP.

The transistors NTR3b and NTR4b are connected in parallel between the output terminal 33 and the ground terminal.

For example, an LOD value DN3 of the transistor NTR3b is smaller than the value dn. An LOD value DN4 of the transistor NTR4b is substantially the same as the LOD value DN3 of the transistor NTR3b.

As illustrated in FIG. 13 and FIGS. 14A to 14C, regarding the N-type transistors connected to the output terminal 33, the two N-type transistors NTR3b and NTR4b are disposed on the respective semiconductor regions AAn2b and AAn3b.

These two N-type transistors NTR3b and NTR4b are connected in parallel between the ground terminal 39 and the output terminal 33.

Accordingly, in the semiconductor device 30 according to the application example, an LOD value of each of the transistors NTR3b and NTR4b may be smaller than an LOD value when two N-type transistors are provided in one semiconductor region.

Figure 15:
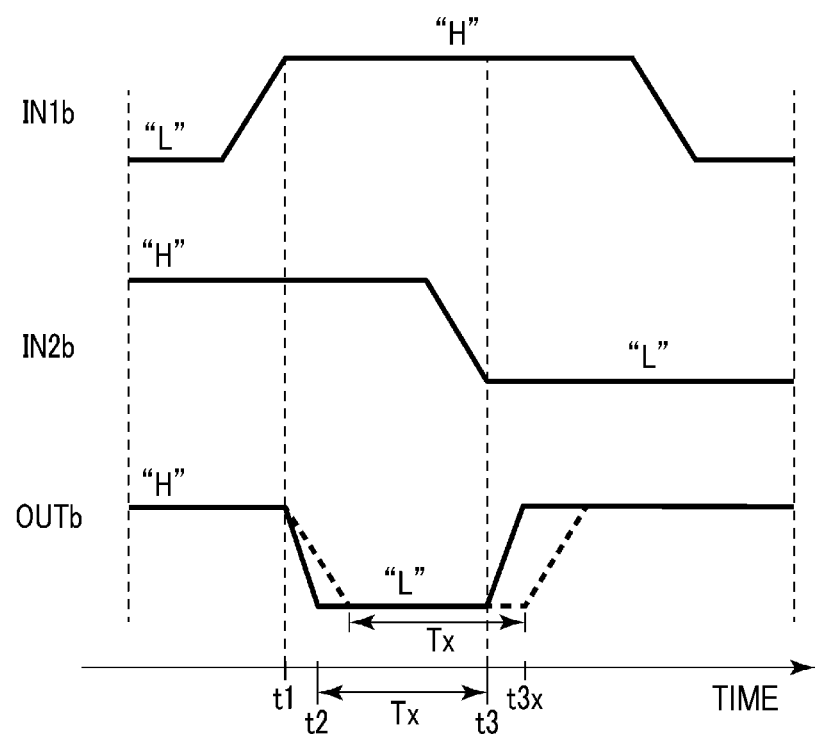
FIG. 15 is a timing diagram illustrating changes in performance in the second application example of the semiconductor device of the embodiment.

FIG. 15 is a view illustrating input/output characteristics of the NAND gate of the present application example. FIG. 15 also illustrates in broken lines input/output characteristics of a conventional NAND gate as a Comparative Example.

For example, an output signal of the NAND gate 30 controls an active state and an inactive state (a stand-by state) of a post-stage circuit connected to the output terminal of the NAND gate 30. In this example, when the output signal of the NAND gate 30 is an "L" level signal, the post-stage circuit is set to an active state. When the output signal of the NAND gate 30 is an "H" level signal, the post-stage circuit is set to a stand-by state.

In the post-stage circuit in a stand-by state, at least one of the N-type transistors NTR1b and NTR2b of the NAND gate 30 is set to an OFF state. As threshold voltages of the N-type transistors rise due to the LOD effect, off leakage currents of the N-type transistors NTR1b and NTR2b are reduced. As a result, power consumption of the NAND gate 30 is reduced.

In the NAND gate 30, when the two input signals IN1b and IN2b have "H" levels, the NAND gate 30 outputs an "L" level signal.

For example, in a state where a signal level of the signal IN2b is set to an "H" level, a signal level of the signal IN1b is changed from an "L" level to an "H" level. Accordingly, a signal level of the output signal OUTb is changed from an "H" level to an "L" level.

As described above, as threshold voltages of the N-type transistors are reduced due to the LOD effect, ON currents of the transistors NTR3b and NTR4b increase, and switching speeds of the transistors NTR3b and NTR4b increase.

As a result, a rising and falling period of a signal level of the output signal OUTb in the NAND gate 30 of this example is shorter than a rising and falling period of a signal level of the output signal in the conventional NAND gate.

As illustrated in FIG. 15, when a period during which the signal OUTb is kept at an "L" level is set as "Tx," in the NAND gate 30 of the present application example, a transition period of the signal level of the output signal OUTb may be short as compared to that in the conventional NAND gate.

In this manner, the NAND gate of the present application example may operate at a high speed. Accordingly, a circuit controlled by an output signal of the NAND gate may also be set to an active state or a stand-by state in a relatively short time.

As described above, the characteristics of the NAND gate of the present application example may be improved.

(c) Third Example

Descriptions will be made on Third Example of the application example of the semiconductor device of the embodiment with reference to FIGS. 16 to 18.

Circuit Example

Figure 16:
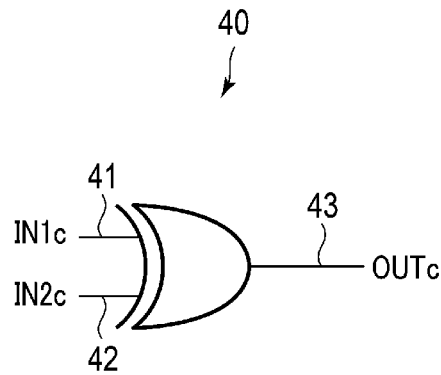
FIG. 16 is a simplified circuit diagram of a third application example of the semiconductor device of the embodiment.

FIG. 16 is a schematic view illustrating an application example of the semiconductor device of the embodiment.

As illustrated in FIG. 16, the semiconductor device of the embodiment is applied to an XOR gate 40.

The XOR gate 40 includes two input terminals 41 and 42, and one output terminal 43. An input signal IN1c is supplied to one input terminal 41 of the XOR gate 40. An input signal IN2c is supplied to the other input terminal 42 of the XOR gate 40. The XOR gate 40 outputs a result of an XOR (exclusive or) operation using the two signals IN1c and IN2c, as an output signal OUTc of the XOR gate 40, from the output terminal 43.

Figure 17:
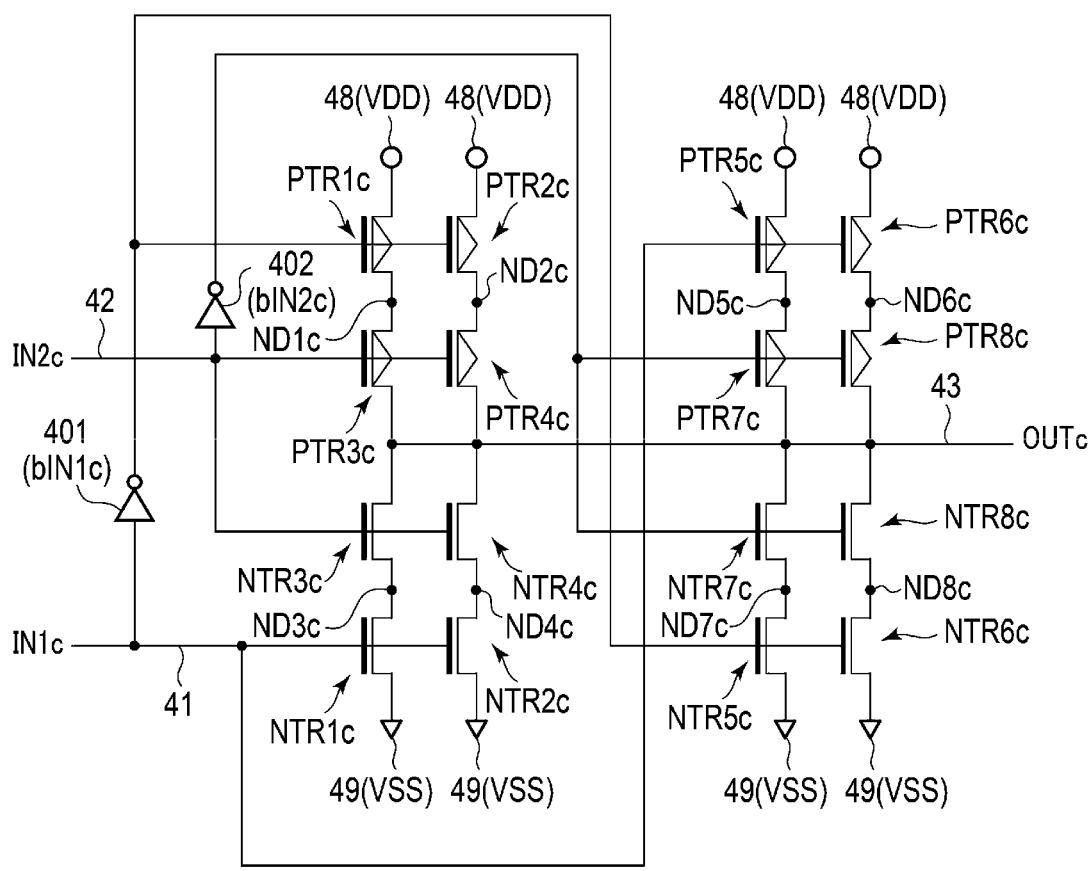
FIG. 17 is a more detailed circuit diagram of the third application example of the semiconductor device of the embodiment.

FIG. 17 is an equivalent circuit diagram of the XOR gate of the application example of the semiconductor device of the embodiment.

As illustrated in FIG. 17, the XOR gate 40 of the present application example includes eight P-type transistors PTR1c, PTR2c, PTR3c, PTR4c, PTR5c, PTR6c, PTR7c, and PTR8c, and eight N-type transistors NTR1c, NTR2c, NTR3c, NTR4c, NTR5c, NTR6c, NTR7c, and NTR8c.

Here, in the circuit 40 of FIG. 17 as the XOR gate, an inverted signal bIN1c of the input signal IN1c and an inverted signal bIN2c of the input signal IN2c are supplied to the XOR gate 40. The inverted signal bIN1c is generated from the signal IN1c by an inverter 401. The inverted signal bIN2c is generated from the signal IN2c by an inverter 402.

One terminal of the P-type transistor PTR1c is connected to a power supply terminal 48. The other terminal of the transistor PTR1c is connected to a node ND1c. One terminal of the P-type transistor PTR2c is connected to the power supply terminal 48. The other terminal of the transistor PTR2c is connected to a node ND2c. Gates of the two transistors PTR1c and PTR2c are connected to the terminal 41 through the inverter 401. The signal bIN1c is supplied to the gates of the transistors PTR1c and PTR2c.

The two transistors PTR1c and PTR2c are connected in parallel between the power supply terminal 48 and the output terminal 43.

One terminal of the P-type transistor PTR3c is connected to the node ND1c. The other terminal of the transistor PTR3c is connected to the output terminal 43. One terminal of the P-type transistor PTR4c is connected to the node ND2c. The other terminal of the transistor PTR4c is connected to the output terminal 43. Gates of the two transistors PTR3 and PTR4c are connected to the input terminal 42. The signal IN2c is supplied to the gates of the transistors PTR3 and PTR4c.

The two transistors PTR3c and PTR4c are connected in parallel between the power supply terminal 48 and the output terminal 43.

One terminal of the P-type transistor PTR5c is connected to the power supply terminal 48. The other terminal of the transistor PTR5c is connected to a node ND5c. One terminal of the P-type transistor PTR6c is connected to the power supply terminal 48. The other terminal of the transistor PTR6c is connected to a node ND6c. Gates of the two transistors PTR5c and PTR6c are connected to the input terminal 41. The signal IN1c is supplied to the gates of the transistors PTR5c and PTR6c.

The two transistors PTR5c and PTR6c are connected in parallel between the power supply terminal 48 and the output terminal 43.

One terminal of the P-type transistor PTR7c is connected to the node ND5c. The other terminal of the transistor PTR7c is connected to the output terminal 43. One terminal of the P-type transistor PTR8c is connected to the node ND6c. The other terminal of the transistor PTR8c is connected to the output terminal 43.

Gates of the two transistors PTR7c and PTR8c are connected to the input terminal 42 through the inverter 402. Accordingly, the inverted signal bIN2c of the signal IN2c is supplied to the gates of the transistors PTR7c and PTR8c.

The two transistors PTR7c and PTR8c are connected in parallel between the power supply terminal 48 and the output terminal 43.

One terminal of the N-type transistor NTR1c is connected to a ground terminal 49. The other terminal of the transistor NTR1c is connected to a node ND3c. One terminal of the N-type transistor NTR2c is connected to the ground terminal 49. The other terminal of the transistor NTR2c is connected to a node ND4c. Gates of the transistors NTR1c and NTR2c are connected to the input terminal 41. Accordingly, the signal IN1c is supplied to the gates of the transistors NTR1c and NTR2c.

The two transistors NTR1c and NTR2c are connected in parallel between the ground terminal 49 and the output terminal 43.

One terminal of the N-type transistor NTR3c is connected to the node ND3c. The other terminal of the transistor NTR3c is connected to the output terminal 43. One terminal of the N-type transistor NTR4c is connected to the node ND4c. The other terminal of the transistor NTR4c is connected to the output terminal 43. Gates of the transistors NTR3c and NTR4c are connected to the input terminal 42. Accordingly, the signal IN2c is supplied to the gates of the transistors NTR3c and NTR4c.

The two transistors NTR3c and NTR4c are connected in parallel between the ground terminal 49 and the output terminal 43.

One terminal of the N-type transistor NTR5c is connected to the ground terminal 49. The other terminal of the transistor NTR5c is connected to a node ND7c. One terminal of the N-type transistor NTR6c is connected to the ground terminal 49. The other terminal of the transistor NTR6c is connected to a node ND8c. Gates of the transistors NTR5c and NTR6c are connected to the input terminal 41 through the inverter 401. Accordingly, the signal bIN1c is supplied to the gates of the transistors NTR5c and NTR6c.

The two transistors NTR5c and NTR6c are connected in parallel between the ground terminal 49 and the output terminal 43.

One terminal of the N-type transistor NTR7c is connected to the node ND7c. The other terminal of the transistor NTR7c is connected to the output terminal 43. One terminal of the N-type transistor NTR8c is connected to the node ND8c. The other terminal of the transistor NTR8c is connected to the output terminal 43. Gates of the transistors NTR7c and NTR8c are connected to the input terminal 42 through the inverter 402. Accordingly, the signal bIN2c is supplied to the gates of the transistors NTR7c and NTR8c.

The two transistors NTR7c and NTR8c are connected in parallel between the ground terminal 49 and the output terminal 43.

Structural Example

Figure 18:
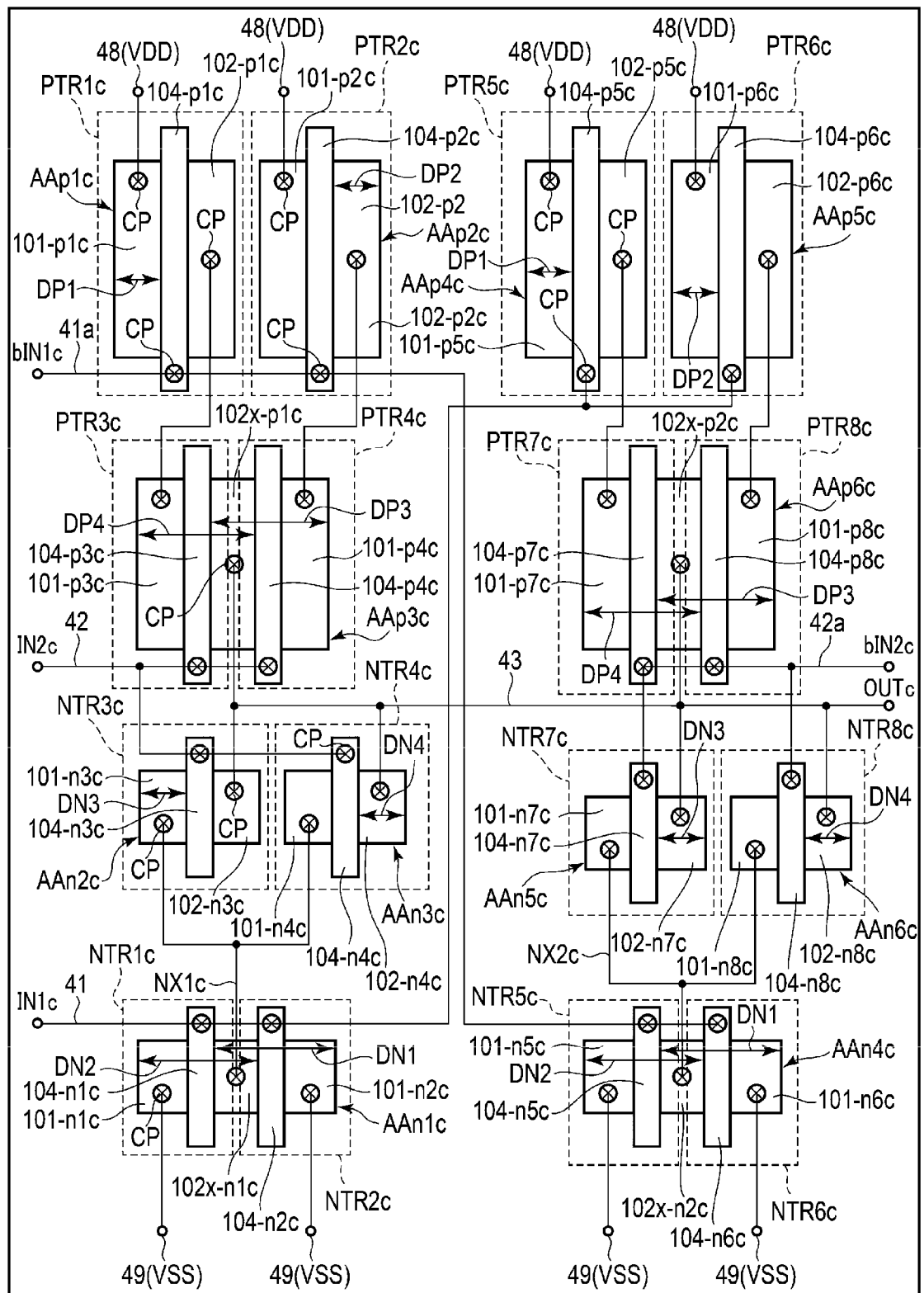
FIG. 18 is a plan view illustrating the third application example of the semiconductor device of the embodiment.

FIG. 18 is a plan view illustrating a layout of the XOR gate of the application example of the semiconductor device of the embodiment. In the semiconductor device of the embodiment, a sectional structure of transistors NTRs and PTRs provided within respective semiconductor regions is substantially the same as the sectional structures of the transistors illustrated in FIGS. 9A to 9C and FIGS. 14A to 14C, and thus descriptions thereof will be omitted herein. In this example, descriptions of a layout and a structure of the inverters 401 and 402 on a substrate in FIG. 17 also will be omitted.

As illustrated in FIG. 18, the two P-type transistors PTR1c and PTR2c directly connected to the power supply terminal 48 are provided in respective semiconductor regions AAp1c and AAp2c. The P-type transistor PTR1c is provided on the semiconductor region AAp1c. The P-type transistor PTR2c is provided on the semiconductor region AAp2c.

A gate electrode 104-p1c of the transistor PTR1c is provided on the semiconductor region AAp1c through a gate insulating film. The gate electrode 104-p1c is connected to wiring 41a to which the signal bIN1c is supplied, through a contact plug CP.

Source/drain diffusion layers 101-p1c and 102-p1c of the transistor PTR1c are formed within the semiconductor region AAp1c. The source/drain diffusion layer 101-p1c is connected to the power supply terminal 48 through a contact plug CP. The source/drain diffusion layer 102-p1c is connected to wiring (node) through a contact plug CP.

A gate electrode 104-p2c of the transistor PTR2c is provided on the semiconductor region AAp2c through a gate insulating film. The gate electrode 104-p2c is connected to the wiring 41a through a contact plug CP.

Source/drain diffusion layers 101-p2c and 102-p2c of the transistor PTR2c are formed within the semiconductor region AAp2c. The source/drain diffusion layer 101-p2c is connected to the power supply terminal 48 through a contact plug CP. The source/drain diffusion layer 102-p2c is connected to the node ND2c through a contact plug CP.

The two P-type transistors PTR3c and PTR4c are provided on a common semiconductor region AAp3c.

Source/drain diffusion layers 101-p3c, 101-p4c, and 102x-p1c of the transistors PTR3c and PTR4c are formed within the semiconductor region AAp3c. The source/drain diffusion layer 101-p3c of the transistor PTR3c is connected to the source/drain diffusion layer 102-p1c of the transistor PTR1c through a contact plug CP and wiring. The source/drain diffusion layer 101-p4c of the transistor PTR4c is connected to the source/drain diffusion layer 102-p2c of the transistor PTR2c through a contact plug CP and wiring ND2c. The P-type transistors PTR3c and PTR4c share the source/drain diffusion layer 102x-p1c. The shared source/drain diffusion layer 102x-p1c is connected to wiring connected to the output terminal 43, through a contact plug CP.

The two N-type transistors NTR1c and NTR2c connected to the ground terminal 49 are provided on one semiconductor region AAn1c.

A gate electrode 104-n1c of the transistor NTR1c is provided on the semiconductor region AAn1c through a gate insulating film. A gate electrode 104-n2c of the transistor NTR2c is provided on the semiconductor region AAn1c through a gate insulating film.

The gate electrodes 104-n1c and 104-n2c are connected to wiring of the input terminal 41 through a contact plug CP.

Source/drain diffusion layers 101-n1c, 101-n2c, and 102x-n1c of the transistors NTR1c and NTR2c are formed within the semiconductor region AAn1c. The source/drain diffusion layer 101-n1c of the transistor NTR1c is connected to the ground terminal 49 through a contact plug CP and wiring. The source/drain diffusion layer 101-n2c of the transistor NTR2c is connected to the ground terminal 49 through a contact plug CP and wiring. The transistors NTR1c and NTR2c share the source/drain diffusion layer 102x-n1c. The shared source/drain diffusion layer 102x-n1c is connected to a node NX1c (ND3c, ND4c) through a contact plug CP. The above described node ND3c is electrically connected to the node ND4c. Accordingly, the node NX1c is formed.

The two N-type transistors NTR3c and NTR4c directly connected to the output terminal 43 are provided within respective semiconductor regions AAn2c and AAn3c.

The transistor NTR3c is provided within the semiconductor region AAn2c. The transistor NTR4c is provided within the semiconductor region AAn3c.

A gate electrode 104-n3c of the transistor NTR3c is provided on the semiconductor region AAn2c through a gate insulating film. The gate electrode 104-n3c is connected to the input terminal 42 through a contact plug CP.

Source/drain diffusion layers 101-n3c and 102-n3c of the transistor NTR3c are formed within the semiconductor region AAn2c. The source/drain diffusion layer 101-n3c is connected to the source/drain diffusion layer 102x-n1c through a contact plug CP and wiring. The source/drain diffusion layer 102-n3c is connected to the output terminal 43 through a contact plug CP and wiring of the node NX1c.

A gate electrode 104-n4c of the transistor NTR4c is provided on the semiconductor region AAn3c through a gate insulating film. The gate electrode 104-n4c is connected to wiring connected to the input terminal 42, through a contact plug CP.

Source/drain diffusion layers 101-n4c and 102-n4c of the transistor NTR4c are formed within the semiconductor region AAn3c. The source/drain diffusion layer 101-n4c is connected to the source/drain diffusion layer 102x-n1c through a contact plug CP and wiring. The source/drain diffusion layer 102-n4c is connected to the output terminal 43 through a contact plug CP.

The P-type transistors PTR5c and PTR6c have substantially the same structure as the structure of the transistors PTR1c and PTR2c. The transistors PTR5c and PTR6c are provided within mutually separated semiconductor regions AAp4c and AAp5c.

A source/drain diffusion layer 101-p5c of the transistor PTR5c and a source/drain diffusion layer 101-p6c of the transistor PTR6c are connected to the power supply terminal 48. A source/drain diffusion layer 102-p5c of the transistor PTR5c is connected to the source/drain diffusion layer 101-p5c of the transistor PTR5c, through a contact plug CP and wiring. A source/drain diffusion layer 102-p6c of the transistor PTR6c is connected to the source/drain diffusion layer 101-p6c of the transistor PTR6c through a contact plug CP and wiring.

A gate electrode 104-p5c of the transistor PTR5c and a gate electrode 104-p6c of the transistor PTR6c are connected to the wiring 41 to which the signal IN1c is supplied.

The P-type transistors PTR7c and PTR8c have substantially the same structure as the structure of the transistors PTR3c and PTR4c. The transistors PTR7c and PTR8c are provided within one semiconductor region AAp6c.

A source/drain diffusion layer 101-p7c of the transistor PTR7c is connected to the source/drain diffusion layer 102-p5c of the transistor PTR5c. A source/drain diffusion layer 101-p8c of the transistor PTR8c is connected to the source/drain diffusion layer 102-p6c of the transistor PTR6c. The transistors PTR7c and PTR8c share a source/drain diffusion layer 102x-p2c. The source/drain diffusion layer 102x-p2c is connected to the output terminal 43 through a contact plug CP.

A gate electrode 104-p1c of the transistor PTR7c and a gate electrode 104-p8c of the transistor PTR8c are connected to wiring 42a to which the signal bIN2c is supplied.

The N-type transistors NTR5c and NTR6c have substantially the same structure as the structure of the transistors NTR1c and NTR2c. The transistors NTR5c and NTR6c are provided within one semiconductor region AAn4c. A source/drain diffusion layer 101-n5c of the transistor NTR5c and a source/drain diffusion layer 101-n6c of the transistor NTR6c are connected to the ground terminal 49. The transistors NTR5c and NTR6c share a source/drain diffusion layer 102x-n2c. The source/drain diffusion layer 102x-n2c is connected to source/drain diffusion layers 101-n7c and 101-n8c of the transistors NTR7c and NTR8c, through a node NX2c.

Gate electrodes 104-n5c and 104-n6c of the transistors NTR5c and NTR6c are connected to the wiring 41a to which the signal bIN1c is supplied.

The N-type transistors NTR7c and NTR8c have substantially the same structure as the structure of the transistors NTR3c and NTR4c. The transistors NTR7c and NTR8c are provided within mutually separated semiconductor regions AAn5c and AAn6c.

The source/drain diffusion layer 101-n7c of the transistor NTR7c and the source/drain diffusion layer 101-n8c of the transistor NTR8c are connected to the source/drain diffusion layer 102x-n2c of the transistors NTR5c and NTR6c. A source/drain diffusion layer 102-n7c of the transistor NTR7c and a source/drain diffusion layer 102-n8c of the transistor NTR8c are connected to the output terminal 43.

A gate electrode 104-n7c of the transistor NTR7c and a gate electrode 104-n8c of the transistor NTR8c are connected to the wiring 42a to which the signal bIN2c is supplied.

As described above, among the plurality of P-type field effect transistors in the XOR gate of the present application example, on the power supply terminal side, two P-type transistors provided within the respective semiconductor regions AAp1c and AAp2c (AAp4c and AAp5c) are connected in parallel, and on the output terminal side, two P-type transistors provided within the common semiconductor region AAp3c (AAp6c) are connected in parallel.

Among the plurality of N-type field effect transistors in the XOR gate of the present application example, on the ground terminal side, two N-type transistors provided within the common semiconductor region AAn1c (AAn4c) are connected in parallel, and on the output terminal side, two N-type transistors provided within the respective semiconductor regions AAn2c and AAn3c (AAn5c and AAn6c) are connected in parallel.

Accordingly, P-type transistors having large LOD values DP3 and DP4 (small threshold voltages), N-type transistors having large LOD values DN1 and DN2 (large threshold voltages), P-type transistors having small LOD values DP1 and DP2 (large threshold voltages), and N-type transistors having small LOD values DN1 and DN2 (small threshold voltages) are arranged between respective nodes within the semiconductor device 1.

Therefore, in the XOR gate of the present application example, an off leakage current may be reduced, and an ON current of a transistor may be increased.

As a result, in the XOR gate of the present application example, power consumption may be reduced, and an operating speed may be improved.

In this manner, the XOR gate of the present application example exhibits improved characteristics.

(d) Fourth Example

Descriptions will be made on Fourth Example of the application example of the semiconductor device of the embodiment with reference to FIGS. 19 to 22.

Circuit Example

Figure 19:
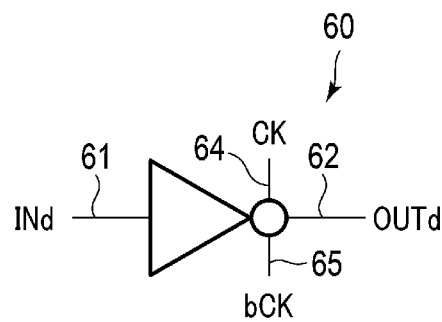
FIG. 19 is a simplified circuit diagram of a fourth application example of the semiconductor device of the embodiment.

FIG. 19 is a schematic view illustrating an application example of the semiconductor device of the embodiment.

As illustrated in FIG. 19, the semiconductor device of the embodiment is applied to a clocked inverter 60.

As illustrated in FIG. 19, the clocked inverter 60 includes one input terminal 61, one output terminal 62, and two control terminals 64 and 65.

A signal INd is supplied to the input terminal 61.

A control signal CK is supplied to one control terminal 64. A control signal bCK is supplied to the other control terminal 65. The control signal Bck and the control signal CK are complementary signals.

When the control signal CK has a first level (when the control signal bCK has a second level), the clocked inverter 60 is set to a low impedance state (also referred to as through state). In this case, the clocked inverter 60 in the low impedance state outputs an inverted signal of the input signal INd, as an output signal OUTd, from the output terminal 62.

When the control signal CK has a second level (when the control signal bCK has a first level), the clocked inverter 60 is set to a high impedance state (also referred to as cutoff state). In this case, even when the input signal INd is supplied to the clocked inverter 60, the clocked inverter 60 cuts off the output of the signal. As a result, in the clocked inverter 60 in the high impedance state, the output signal OUTd is placed in an undefined state.

Figure 20:
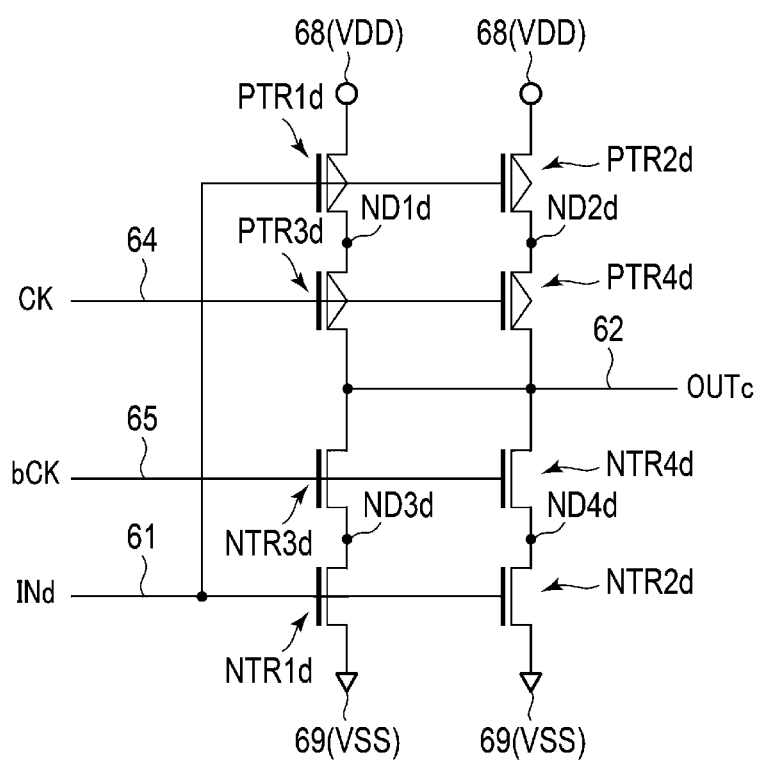
FIG. 20 is a more detailed circuit diagram of the fourth application example of the semiconductor device of the embodiment.

FIG. 20 is an equivalent circuit diagram of the clocked inverter as the application example of the semiconductor device of the embodiment.

As illustrated in FIG. 20, the clocked inverter 60 as the application example includes four P-type field effect transistors PTR1d, PTR2d, PTR3d, and PTR4d, and four N-type field effect transistors NTR1d, NTR2d, NTR3d, and NTR4d.

Gates of the P-type transistors PTR1d and PTR2d are connected to the input terminal 61. One terminal of the transistor PTR1d is connected to a power supply terminal 68. The other terminal of the transistor PTR1d is connected to a node ND1d. One terminal of the transistor PTR2d is connected to the power supply terminal 68. The other terminal of the transistor PTR2d is connected to a node ND2d.

The transistors PTR1d and PTR2d are connected in parallel between the output terminal 62 and the power supply terminal 68.

Gates of the P-type transistors PTR3d and PTR4d are connected to the control terminal 64. One terminal of the transistor PTR3d is connected to the node ND1d. The other terminal of the transistor PTR3d is connected to the output terminal 62. One terminal of the transistor PTR4d is connected to the node ND2d. The other terminal of the transistor PTR4d is connected to the output terminal 62.

The transistors PTR3d and PTR4d are connected in parallel between the output terminal 62 and the power supply terminal 68.

Gates of the N-type transistors NTR1d and NTR2d are connected to the input terminal 61.

One terminal of the transistor NTR1d is connected to a ground terminal 69. The other terminal of the transistor NTR1d is connected to a node ND3d. One terminal of the transistor NTR2d is connected to the ground terminal 69. The other terminal of the transistor NTR2d is connected to a node ND4d.

The transistors NTR1d and NTR2d are connected in parallel between the output terminal 62 and the ground terminal 69.

Gates of the N-type transistors NTR3d and NTR4d are connected to the control terminal 65. One terminal of the transistor NTR3d is connected to the node ND3d. The other terminal of the transistor NTR3d is connected to the output terminal 62.

One terminal of the transistor NTR4d is connected to the node ND4d. The other terminal of the transistor NTR4d is connected to the output terminal 62.

The transistors NTR3d and NTR4d are connected in parallel between the output terminal 62 and the ground terminal 69.

The clocked inverter 60 outputs the signal OUTd (an inverted signal of the input signal INd) according to control by the control signals CK and bCK.

Structural Example

Figure 21:
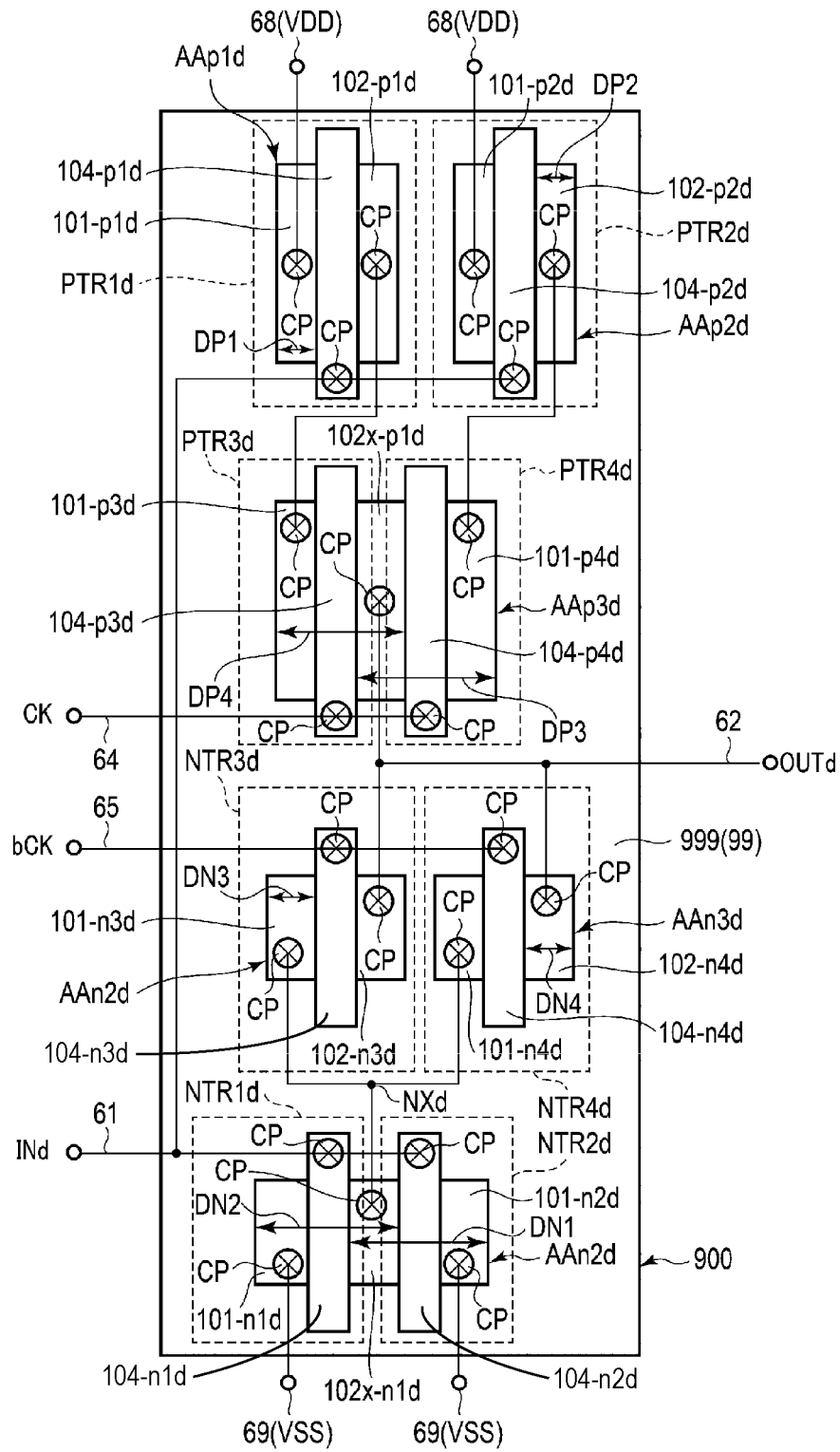
FIG. 21 is a plan view illustrating the fourth application example of the semiconductor device of the embodiment.

FIG. 21 is a plan view illustrating a layout of the clocked inverter as the application example of the semiconductor device of the embodiment. A sectional structure of each transistor is substantially the same as the structures illustrated in FIGS. 9A to 9C and FIGS. 14A to 14C, and thus descriptions thereof will be omitted herein.

As illustrated in FIG. 21, among a plurality of transistors making up the clocked inverter 60 of the present application example, the two P-type transistors PTR3d and PTR4d directly connected to the output terminal 62 are provided within one semiconductor region AAp3d.

A gate electrode 104-p3d of the transistor PTR3d is provided above the semiconductor region AAp3d through a gate insulating film. A gate electrode 104-p4d of the transistor PTR4d is provided above the semiconductor region AAp3d through a gate insulating film.

The transistor PTR3d and the transistor PTR4d share a source/drain diffusion layer 102x-p1d within the semiconductor region AAp3d. The source/drain diffusion layer 102x-p1d is connected to the wiring of the output terminal 62 through a contact plug CP.

A source/drain diffusion layer 101-p3d of the transistor PTR3d is formed within the semiconductor region AAp3d. The source/drain diffusion layer 101-p3d is connected to a source/drain diffusion layer 102-p1d of the transistor PTR1d through a contact plug CP and wiring.

A source/drain diffusion layer 101-p4d of the transistor PTR4d is formed within the semiconductor region AAp3d. The source/drain diffusion layer 101-p4d is connected to a source/drain diffusion layer 102-p2d of the transistor PTR2d through a contact plug CP.

The gate electrodes 104-p3d and 104-p4d are connected to the control terminal 64 through a contact plug CP and wiring.

The transistors PTR3d and PTR4d have LOD values DP3 and DP4 (>dp).

The two P-type transistors PTR1d and PTR2d connected to the power supply terminal 68 are provided within respective semiconductor regions AAp1d and AAp2d.

The transistor PTR1d is provided in the semiconductor region AAp1d. The transistor PTR2d is provided within the semiconductor region AAp2d.

A gate electrode 104-p1d of the transistor PTR1d is provided above the semiconductor region AAp1d, through a gate insulating film. Source/drain diffusion layers 101-p1d and 102-p1d of the transistor PTR1d are formed within the semiconductor region AAp1d. The source/drain diffusion layer 101-p1d is connected to the power supply terminal 68 through a contact plug CP. The source/drain diffusion layer 102-p1d is connected to the source/drain diffusion layer 101-p3d.

A gate electrode 104-p2d of the transistor PTR2d is provided above the semiconductor region AAp2d, through a gate insulating film. Source/drain diffusion layers 101-p2d and 102-p2d of the transistor PTR2d are formed within the semiconductor region AAp2d. The source/drain diffusion layer 101-p2d is connected to the power supply terminal 68 through a contact plug CP. The source/drain diffusion layer 102-p2d is connected to the source/drain diffusion layer 101-p4d.

The gate electrodes 104-p1d and 104-p2d are connected to the input terminal 61 through a contact plug CP and wiring.

In this manner, each of the two transistors PTR1d and PTR2d directly connected to the power supply terminal 68 is provided in a corresponding one of the two semiconductor regions AAp1d and AAp2d isolated by the element isolation layer 99.

LOD values DP1 and DP2 of the transistors PTR1d and PTR2d are smaller the LOD values DP3 and DP4 of the transistors PTR3d and PTR4d.

The two N-type transistors NTR1d and NTR2d connected to the ground terminal 69 are provided within one semiconductor region AAn1d.

A gate electrode 104-n1d of the transistor NTR1d is provided above the semiconductor region AAn1d, through a gate insulating film. A gate electrode 104-n2d of the transistor NTR2d is provided above the semiconductor region AAn1d, through a gate insulating film.

The transistor NTR1d and the transistor NTR2d share a source/drain diffusion layer 102x-n1d within the semiconductor region AAn1d. The source/drain diffusion layer 102x-n1d is connected to wiring (node) through a contact plug CP.

A source/drain diffusion layer 101-n1d of the transistor NTR1d is formed within the semiconductor region AAn1d. The source/drain diffusion layer 101-n1d is connected to the ground terminal 69 through a contact plug CP. A source/drain diffusion layer 101-n2d of the transistor NTR2d is formed within the semiconductor region AAn1d. The source/drain diffusion layer 101-n2d is connected to the ground terminal 69 through a contact plug CP.

The transistors NTR1d and NTR2d have LOD values DN1 and DN2 (>dn).

The two N-type transistors NTR3d and NTR4d directly connected to the output terminal 62 are provided within respective semiconductor regions AAn2d and AAn3d.

The transistor NTR3d is provided within the semiconductor region AAn2d. The transistor NTR4d is provided within the semiconductor region AAn3d.

A gate electrode 104-n3d of the transistor NTR3d is provided above the semiconductor region AAn2d, through a gate insulating film. Source/drain diffusion layers 101-n3d and 102-n3d of the transistor NTR3d are formed within the semiconductor region AAn2d.

The source/drain diffusion layer 101-n3d is connected to the source/drain diffusion layer 102x-n1d of the transistors NTR1d and NTR2d through a contact plug CP and wiring (a node NXd). The source/drain diffusion layer 102-n3d is connected to the output terminal 62 through a contact plug CP.

A gate electrode 104-n4d of the transistor NTR4d is provided above the semiconductor region AAn3d, through a gate insulating film. Source/drain diffusion layers 101-n4d and 102-n4d of the transistor NTR4d are formed within the semiconductor region AAn3d. The source/drain diffusion layer 101-n4d is connected to the source/drain diffusion layer 102x-n1d of the transistors NTR1d and NTR2d through a contact plug CP and wiring. The source/drain diffusion layer 102-n4d is connected to the output terminal 62 through a contact plug CP.

In this manner, each of the two transistors NTR3d and NTR4d connected to the output terminal 62 is provided within a corresponding one of the two semiconductor regions AAn2d and AAn3d isolated by the element isolation layer 99.

LOD values DN3 and DN4 of the transistors NTR3d and NTR4d are smaller than the LOD values DN1 and DN2 of the transistors NTR1d and NTR2d.

Figure 22:
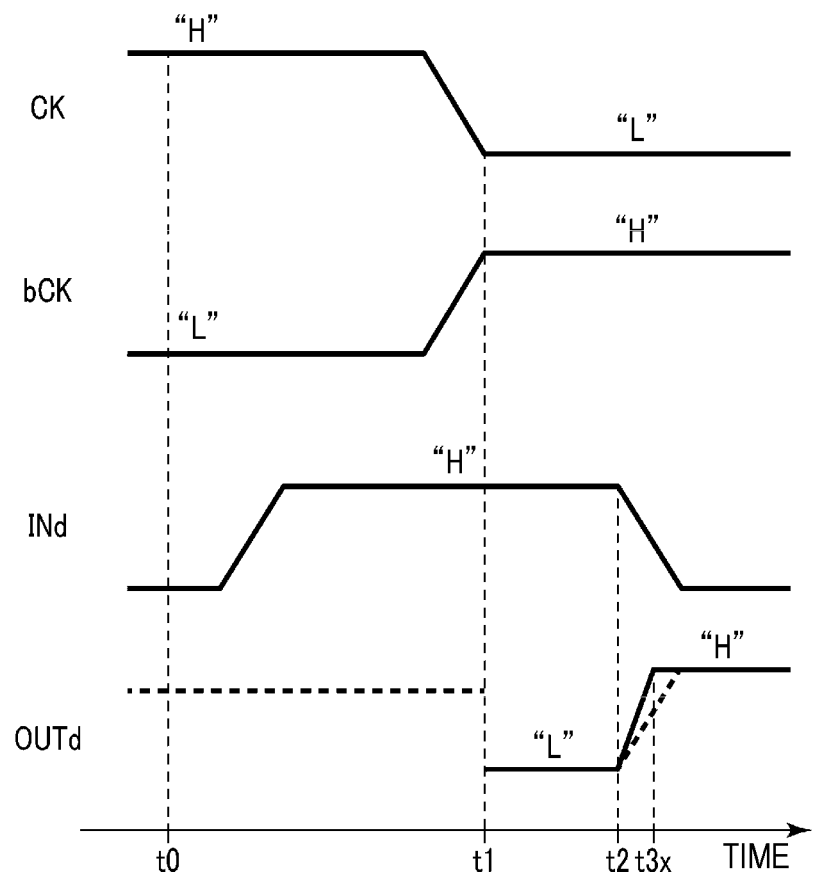
FIG. 22 is a timing diagram illustrating changes in the performance in the fourth application example of the semiconductor device of the embodiment.

FIG. 22 is a view illustrating input/output characteristics of the clocked inverter of the present application example.

When the control signal CK has an "H" level, the clocked inverter 60 is set to a cutoff state.

In the clocked inverter 60 in the cutoff state, the P-type transistors PTR3d and PTR4d and the N-type transistors PNTR3d and NTR4d are placed in an OFF state.

As threshold voltages of the N-type transistors rise due to the LOD effect, off leakage currents of the N-type transistors NTR are reduced. Due to the LOD effect, threshold voltages of the P-type transistors PTR1d and PTR2d are relatively high.

As a result, power consumption of the clocked inverter 60 is reduced.

When the control signal CK has an "L" level, the clocked inverter 60 is set to a through state.

In the clocked inverter 60 in the through state, with respect to an input signal INd at an "H" level, the clocked inverter 60 outputs an "L" level signal OUTd. Meanwhile, with respect to an input signal INd at an "L" level, the clocked inverter 60 outputs an "H" level signal.

As threshold voltages of the transistors are reduced due to the LOD effect, ON currents of the P-type transistors TR3d and PTR4d, and ON currents of the N-type transistors NTR3d and NTR4d increase. Accordingly, a response speed of the transistors NTR3d, NTR4d, PTR3d, and PTR4d may increase.

As a result, an operating speed of the clocked inverter 60 is improved.

In this manner, the clocked inverter of the present application example has improved performance characteristics.

(e) Fifth Example

Descriptions will be made on Fifth Example of the application example of the semiconductor device of the embodiment with reference to FIGS. 23 to 25.

For example, the semiconductor device of the embodiment may be applied to a logic circuit including a plurality of logic gates.

Circuit Example

Figure 23:
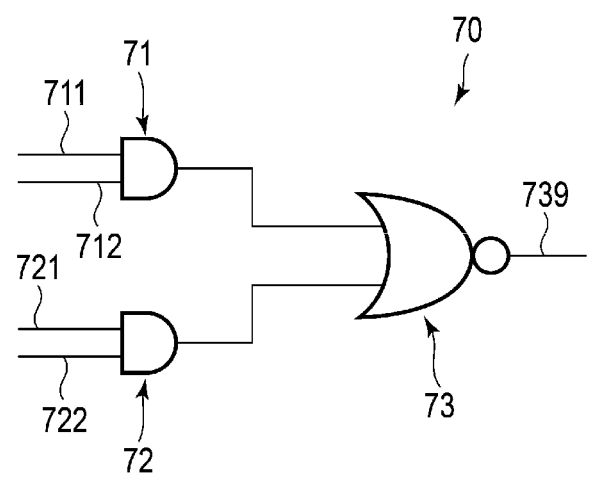
FIG. 23 is a simplified circuit diagram of a fifth application example of the semiconductor device of the embodiment.

FIG. 23 is a view illustrating a logic circuit of the present application example.

As illustrated in FIG. 23, a logic circuit 70 of the present application example includes two AND gates 71 and 72, and a NOR gate 73.

An input signal IN1e is supplied to one input terminal 711 of the first AND gate 71. An input signal IN2e is supplied to the other input terminal 712 of the first AND gate 71. The first AND gate 71 outputs an AND operation (logical AND operation) result OUT1e of the two signals IN1e and IN2e.

An input signal IN3e is supplied to one input terminal 721 of the second AND gate 72. An input signal IN4e is supplied to the other input terminal 722 of the second AND gate 72. The second AND gate 72 outputs an AND operation result OUT2e of the two signals IN3e and IN4e.

An output signal of the first AND gate 71 is supplied to one input terminal of the NOR gate 73. An output signal of the second AND gate 72 is supplied to the other input terminal of the NOR gate 73.

The NOR gate 73 outputs a NOR operation (negative OR operation) result of the two signals, from an output terminal 739. An output signal OUTe of the NOR gate 73 is output, as an output signal of the logic circuit 70, to another circuit connected to the circuit 70.

Figure 24:
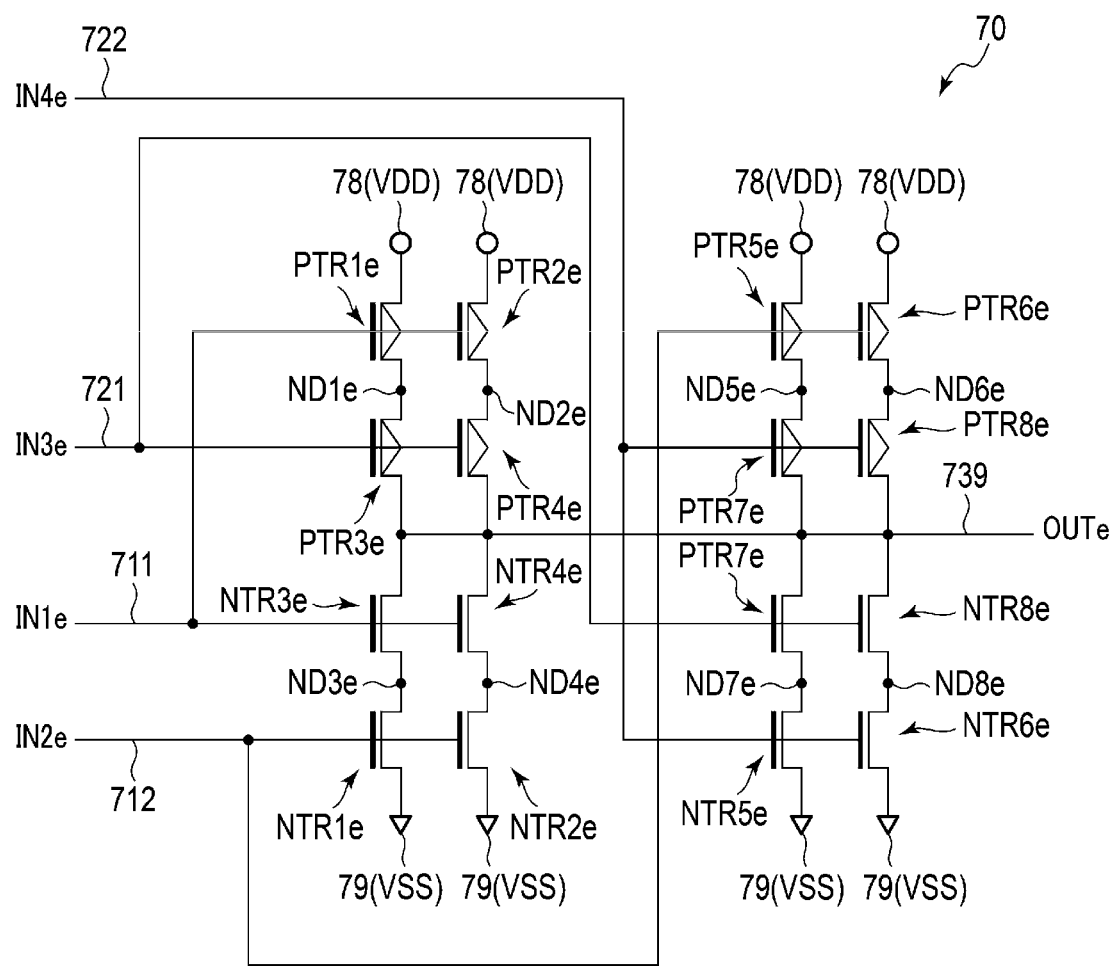
FIG. 24 is a more detailed circuit diagram of the fifth application example of the semiconductor device of the embodiment.

FIG. 24 is an equivalent circuit diagram of a logic circuit of the present application example.

As illustrated in FIG. 24, the logic circuit 70 of the present application example includes eight P-type field effect transistors PTR1e, PTR2e, PTR3e, PTR4e, PTR5e, PTR6e, PTR7e, and PTR8e, and eight N-type field effect transistors NTR1e, NTR2e, NTR3e, NTR4e, NTR5e, NTR6e, NTR7e, and NTR8e.

In FIG. 24, a connection relationship between N-type/P-type transistors NTR and PTR, a connection relationship between a power supply terminal and the P-type transistors, and a connection relationship between a ground terminal and the N-type transistors are the same as the connection relationships in the circuit of FIG. 15. Thus, descriptions of connection relationships between transistors, a power supply terminal, and a ground terminal shown in FIG. 24, will be omitted.

In the logic circuit 70 of FIG. 24, connection relationships of an input terminal and an output terminal with transistors are as follows.

Gates of the P-type transistors PTR1e and PTR2e are connected to the input terminal 711. Gates of the P-type transistors PTR3e and PTR4e are connected to the input terminal 721. Gates of the P-type transistors PTR5e and PTR6e are connected to the input terminal 712. Gates of the P-type transistors PTR7e and PTR8e are connected to the input terminal 722.

Gates of the N-type transistors NTR1e and NTR2e are connected to the input terminal 712. Gates of the N-type transistors NTR3e and NTR4e are connected to the input terminal 711. Gates of the N-type transistors NTR5e and NTR6e are connected to the input terminal 722. Gates of the N-type transistors NTR7e and NTR8e are connected to the input terminal 721.

Among the plurality of P-type transistors, current paths of the transistors PTR3e, PTR4e, PTR7e, and PTR8e are connected to the output terminal. Current paths of the transistors PTR1e, PTR2e, PTR5e, and NTR6e are connected to a power supply terminal 78.

Among the plurality of N-type transistors, current paths of the transistors NTR3e, NTR4e, NTR7e, and NTR8e are connected to the output terminal 739. Current paths of the transistors NTR1e, NTR2e, NTR5e, and NTR6e are connected to a ground terminal 79.

According to FIG. 24, a circuit equivalent to the circuit of FIG. 23 is formed.

Structural Example

Figure 25:
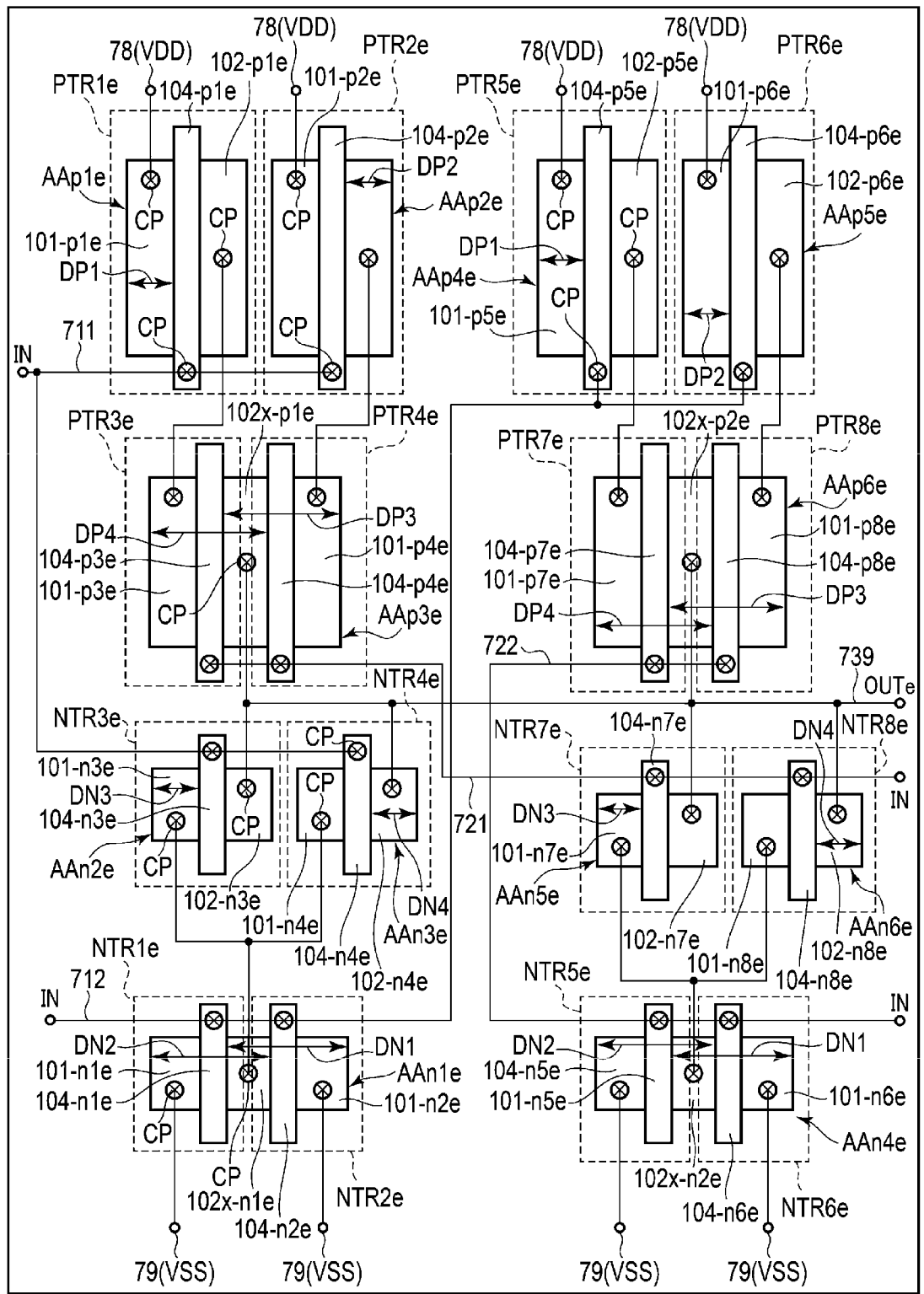
FIG. 25 is a plan view illustrating fifth application example of the semiconductor device of the embodiment.

FIG. 25 is a plan view illustrating a layout of the logic circuit as the application example of the semiconductor device of the embodiment.

As illustrated in FIG. 25, a plurality of transistors and semiconductor regions of the logic circuit in this example are laid out on a substrate in the substantially same manner as transistors and semiconductor regions in the circuit in the example illustrated in FIGS. 17 and 18. Thus, in view of the substantially same structure between FIGS. 18 and 25, descriptions on the structure of transistors in the logic circuit of this example will be simplified.

Source/drain diffusion layers 101-p1e, 101-p2e, 101-p5e, and 101-p6e of the P-type transistors PTR1e, PTR2e, PTR5e, and PTR6e are connected to the power supply terminal 78.

Gate electrodes 104-p1e and 104-p2e of the transistors PTR1e and PTR2e are connected to the input terminal 711. Gate electrodes 104-p5e and 104-p6e of the transistors PTR5e and PTR6e are connected to the input terminal 712.

The transistors PTR1e and PTR2e are provided in mutually separated semiconductor regions AAp1e and AAp2e. Likewise, the transistors PTR5e and PTR6e are provided in mutually separated semiconductor regions AAp4e and AAp5e.

Source/drain diffusion layers 102x-p1e and 102x-p2e of the P-type transistors PTR3e, PTR4e, PTR7e, and PTR8e are connected to the output terminal 739.

Gate electrodes 104-p3e and 104-p4e of the transistors PTR3e and PTR4e are connected to the input terminal 721. Gate electrodes 104-p7e and 104-p8e of the transistors PTR7e and PTR8e are connected to the input terminal 722.

The two transistors PTR3e and PTR4e are provided within one semiconductor region AAp3e. Likewise, the two transistors PTR7e and PTR8e are provided within one semiconductor region AAp6e.

Source/drain diffusion layers 101-n1e, 101-n2e, 101-n5e, and 101-n6e of the N-type transistors NTR1e, NTR2e, NTR5e, and NTR6e are connected to the ground terminal 79.

Gate electrodes 104-n1e and 104-n2e of the transistors NTR1e and NTR2e are connected to the input terminal 712. Gate electrodes 104-n5e and 104-n6e of the transistors NTR5e and NTR6e are connected to the input terminal 722.

The two transistors NTR1e and NTR2e are provided within one semiconductor region AAn1e. Likewise, the transistors NTR5e and NTR6e are provided within one semiconductor region AAn4e.

Source/drain diffusion layers 102-n3e, 102-n4e, 102-n7e, and 102-n8e of the N-type transistors NTR3e, NTR4e, NTR7e, and NTR8e are connected to the output terminal 739.

Gate electrodes 104-n3e and 104-n4e of the transistors NTR3e and NTR4e are connected to the input terminal 711. Gate electrodes 104-n7e and 104-n8e of the transistors NTR7e and NTR8e are connected to the input terminal 721.

The two transistors NTR3e and NTR4e are provided within respective semiconductor regions AAn2e and AAn3e. Likewise, the transistors NTR7e and NTR8e are provided within respective semiconductor regions AAn5e and AAn6e.

In the logic circuit of the present application example, as in the above described examples, an LOD value of each transistor between nodes is set.

In relation to two stages on current paths between the power supply terminal 78 and the output terminal 739, in the stage on the power supply terminal 78 side, the two P-type transistors PTR1 and PTR2 (PTR5 and PTR6) are connected in parallel. The two P-type transistors PTR1 and PTR2 (PTR5 and PTR6) connected in parallel on the power supply terminal 78 side are provided within mutually independent semiconductor regions. In the stage on the output terminal 739 side, the two P-type transistors PTR3 and PTR4 (PTR7 and PTR8) are connected in parallel. The two P-type transistors PTR3 and PTR4 (PTR7 and PTR8) connected in parallel on the output terminal 739 side are provided in a common semiconductor region. In each of the two P-type transistors PTR3 and PTR4 (PTR7 and PTR8) within the common semiconductor region, an LOD value DP3 (DP4) of the P-type transistor is larger than an LOD value DP1 (DP2) of the P-type transistor PTR1 (PTR2, PTR5, and PTR6) provided in one independent semiconductor region.

In relation to two stages on current paths between the ground terminal 79 and the output terminal 739, in the stage on the ground terminal 79 side, the two N-type transistors NTR1 and NTR2 (NTR5 and NTR6) are connected in parallel. The two N-type transistors NTR1 and NTR2 (NTR5 and NTR6) connected in parallel on the ground terminal 79 side are provided within a common semiconductor region. In the stage on the output terminal 739 side, the two N-type transistors NTR3 and NTR4 (NTR7 and NTR8) are connected in parallel. The two N-type transistors NTR3 and NTR4 (NTR7 and NTR8) connected in parallel on the output terminal 739 side are provided within respective semiconductor regions.

In each of the two N-type transistors NTR1 and NTR2 (NTR5 and NTR6) within the common semiconductor region, an LOD value DN1 (DN2) of the N-type transistor NTR1 (NTR2, NTR5, and NTR6) is larger than an LOD value DN3 (DN4) of the N-type transistor NTR3 (NTR4, NTR7, and NTR8) provided in one independent semiconductor region.

Accordingly, in the logic circuit of the present application example, it is possible to achieve a reduction of power consumption and an improvement of an operating speed.

As a result, the logic circuit of the present application example has improved performance characteristics.

(f) Sixth Example

Descriptions will be made on Sixth Example of the application example of the semiconductor circuit of the embodiment with reference to FIGS. 26 to 28.

The semiconductor device of the embodiment may be applied to an analog circuit.

Circuit Example

Figure 26:
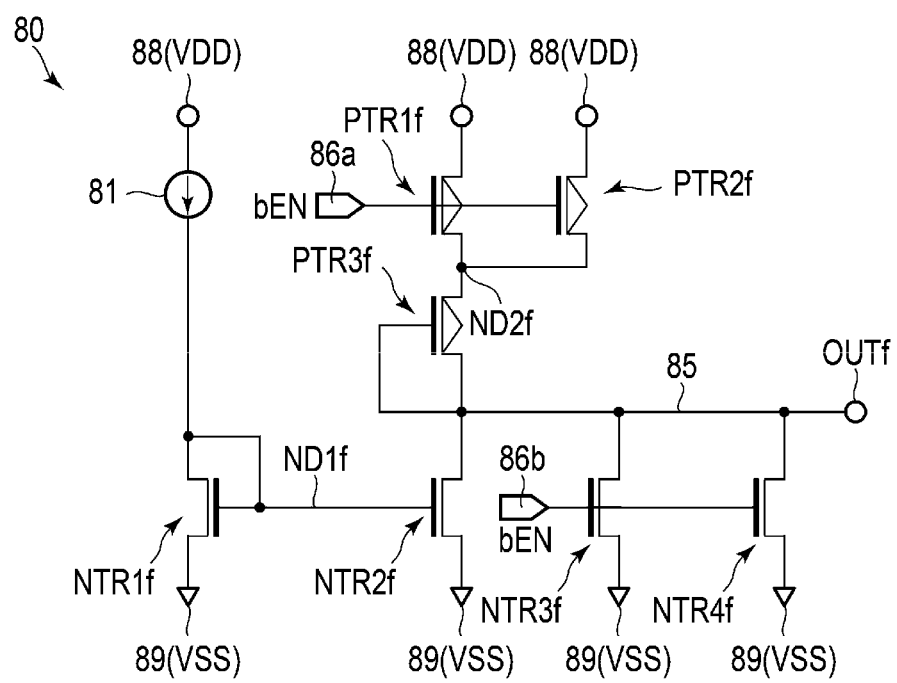
FIG. 26 is a circuit diagram of a sixth application example of the semiconductor device of the embodiment.

FIG. 26 is an equivalent circuit diagram illustrating the analog circuit as the application example of the semiconductor device of the embodiment.

As illustrated in FIG. 26, an analog circuit 80 of the present application example includes a constant current source 81, a plurality of P-type field effect transistors PTR1f, PTR2f, and PTR3f, and a plurality of N-type field effect transistors NTR1f, NTR2f, NTR3f, and NTR4f.

One terminal of the N-type transistor NTR1f is connected to a ground terminal 89. The other terminal of the transistor NTR1f is connected to the constant current source 81. A gate of the transistor NTR1f is connected to a node ND1f. The gate of the transistor NTR1f is connected to an output terminal of the constant current source 81 and the other terminal of the transistor NTR1*f*.

One terminal of the N-type transistor NTR2*f* is connected to the ground terminal 89. The other terminal of the transistor NTR2*f* is connected to an output terminal 85. A gate of the transistor NTR2*f* is connected to the node ND1*f*. The gate of the transistor NTR2*f* is connected to the gate of the transistor NTR1*f* through the node ND1*f*.

One terminal of the P-type transistor PTR1*f* is connected to a power supply terminal 88. The other terminal of the transistor PTR1*f* is connected to a node ND2*f*. One terminal of the P-type transistor PTR2*f* is connected to the power supply terminal 88. The other terminal of the transistor PTR2*f* is connected to the node ND2*f*. A control signal bEN is supplied to gates of the transistors PTR1*f* and PTR2*f*.

The two P-type transistors PTR1*f* and PTR2*f* are connected in parallel between the node ND2*f* (the output terminal 85) and the power supply terminal 88.

One terminal of the P-type transistor PTR3*f* is connected to the node ND2*f*. The other terminal of the transistor PTR3*f* is connected to the output terminal 85. A gate of the transistor PTR3*f* is connected to the output terminal 85.

One terminal of the N-type transistor NTR3*f* is connected to the ground terminal 89. The other terminal of the transistor NTR3*f* is connected to the output terminal 85.

One terminal of the N-type transistor NTR4*f* is connected to the ground terminal 89. The other terminal of the transistor NTR4*f* is connected to the output terminal 85. The control signal bEN is supplied to gates of the transistors NTR3*f* and NTR4*f*.

The two transistors NTR3*f* and NTR4*f* are connected in parallel between the ground terminal 89 and the output terminal 85.

Structural Example

Figure 27:
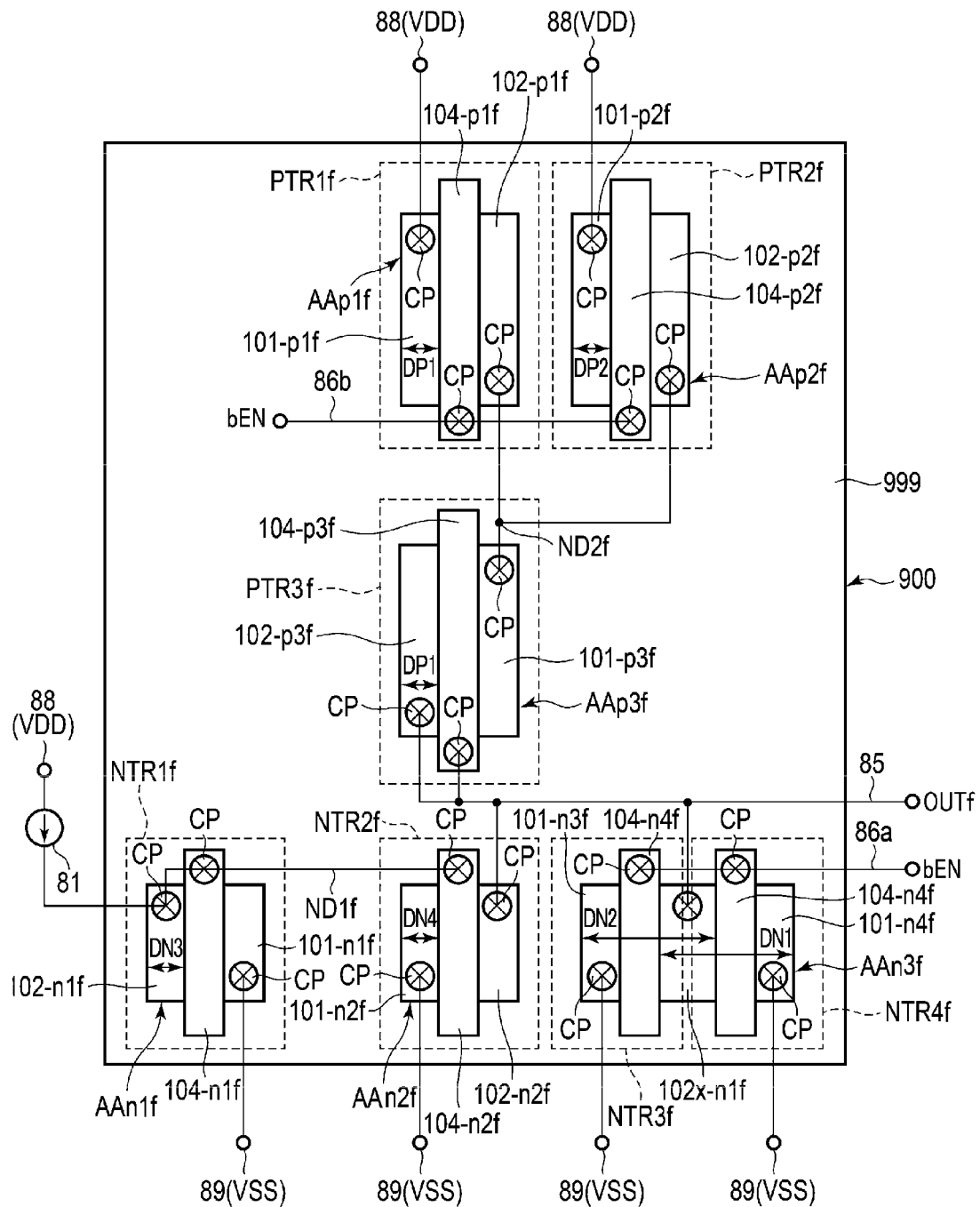
FIG. 27 is a plan view illustrating the sixth application example of the semiconductor device of the embodiment.

FIG. 27 is a plan view illustrating a layout of the analog circuit as the application example of the semiconductor device of the embodiment. A sectional structure of each transistor in FIG. 27 is similar to the examples illustrated in FIGS. 9A to 9C and FIGS. 14A to 14C, and thus the illustration thereof will be omitted for this application example.

As illustrated in FIG. 27, a plurality of semiconductor regions AAp1*f*, AAp2*f*, AAp3*f*, AAn1*f*, AAn2*f*, and AAn3*f* are formed within the semiconductor substrate 900.

The N-type transistor NTR1*f* is provided within the semiconductor region AAn1*f*.

In the transistor NTR1*f*, source/drain diffusion layers 101-*n*1*f* and 102-*n*1*f* are formed within the semiconductor region AAn1*f*. A gate electrode 104-*n*1*f* is provided above a channel region between the two source/drain diffusion layers 101-*n*1*f* and 102-*n*1*f*, through a gate insulating film.

The source/drain diffusion layer 101-*n*1*f* is connected to the ground terminal 89. The source/drain diffusion layer 102-*n*1*f* is connected to the constant current source 81. The gate electrode 104-*n*1*f* is connected to the source/drain diffusion layer 102-*n*1*f* and the node ND1*f*.

The N-type transistor NTR2*f* is provided within the semiconductor region AAn2*f*.

In the transistor NTR2*f*, source/drain diffusion layers 101-*n*2*f* and 102-*n*2*f* are formed within the semiconductor region AAn2*f*. A gate electrode 104-*n*2*f* is provided above a channel region between the two source/drain diffusion layers 101-*n*2*f* and 102-*n*2*f*, through a gate insulating film.

The source/drain diffusion layer 101-*n*2*f* is connected to the ground terminal 89. The source/drain diffusion layer 102-*n*2*f* is connected to the output terminal 85. The gate electrode 104-*n*2*f* is connected to the node ND1*f*. Accordingly, the gate electrodes 104-*n*1*f* and 104-*n*2*f* of the two transistors NTR1*f* and NTR2*f* are connected to each other by the node ND1*f*.

The N-type transistors NTR3*f* and NTR4*f* are provided within the common semiconductor region AAn3*f*.

In the two transistors NTR3*f* and NTR4*f*, source/drain diffusion layers 101-*n*3*f*, 101-*n*4*f*, and 102*x*-*n*1*f* are formed within the semiconductor region AAn3*f*. Gate electrodes 104-*n*3*f* and 104-*n*4*f* are provided above the semiconductor region AAn3*f*, through a gate insulating film.

The source/drain diffusion layer 102*x*-*n*1*f* is formed within the semiconductor region AA3*nf*, between the two gate electrodes 104-*n*3*f* and 104-*n*4*f*. The source/drain diffusion layer 102*x*-*n*1*f* is shared by the two transistors NTR3*f* and NTR4*f*.

The source/drain diffusion layers 101-*n*3*f* and 101-*n*4*f* are connected to the ground terminal 89.

The source/drain diffusion layer 102*x*-*n*1*f* is connected to the output terminal 85. The gate electrodes 104-*n*3*f* and 104-*n*4*f* are connected to a control terminal 86*a*. The control signal bEN is supplied to the control terminal 86*a*.

The N-type transistors NTR3*f* and NTR4*f* have values DN3 and DN4 as LOD values. The N-type transistors NTR1*f* and NTR2*f* have values DN1 as LOD values.

The P-type transistor PTR1*f* is provided within the semiconductor region AAp1*f*.

In the transistor PIR1*f*, source/drain diffusion layers 101-*p*1*f* and 102-*p*1*f* are formed within the semiconductor region AAp1*f*. A gate electrode 104-*p*1*f* is provided above the semiconductor region AAp1*f*, through a gate insulating film.

The source/drain diffusion layer 101-*p*1*f* is connected to the power supply terminal 88. The source/drain diffusion layer 102-*p*1*f* is connected to the node ND2*f*. The gate electrode 104-*p*1*f* is connected to a control terminal 86*b*. The control signal bEN is supplied to the control terminal 86*b*.

The P-type transistor PTR2*f* is provided within the semiconductor region AAp2*f*.

In the transistor PTR2*f*, source/drain diffusion layers 101-*p*2*f* and 102-*p*2*f* are formed within the semiconductor region AAp2*f*. A gate electrode 104-*p*2*f* is provided above the semiconductor region AAp2*f*, through a gate insulating film.

The source/drain diffusion layer 101-*p*2*f* is connected to the power supply terminal 88. The source/drain diffusion layer 102-*p*2*f* is connected to the node ND2*f*. The gate electrode 104-*p*2*f* is connected to the control terminal 86*b*.

In the present application example, the semiconductor region AAp2*f* is electrically isolated from the semiconductor region AAp1*f* by the element isolation area 999. The P-type transistors PTR1*f* and PTR2*f* have values DP1 and DP2 as LOD values.

The P-type transistor PTR3*f* is provided within the semiconductor region AAp3*f*. In the transistor PTR3*f*, source/drain diffusion layers 101-*p*3*f* and 102-*p*3*f* are formed within the semiconductor region AAp3*f*. A gate electrode 104-*p*3*f* is provided above the semiconductor region AAp3*f*, through a gate insulating film.

The source/drain diffusion layer 101-*p*3*f* is connected to the node ND2*f*. The source/drain diffusion layer 102-*p*3*f* is connected to the output terminal 85. The gate electrode 104-*p*3*f* is connected to the output terminal 85.

Figure 28:
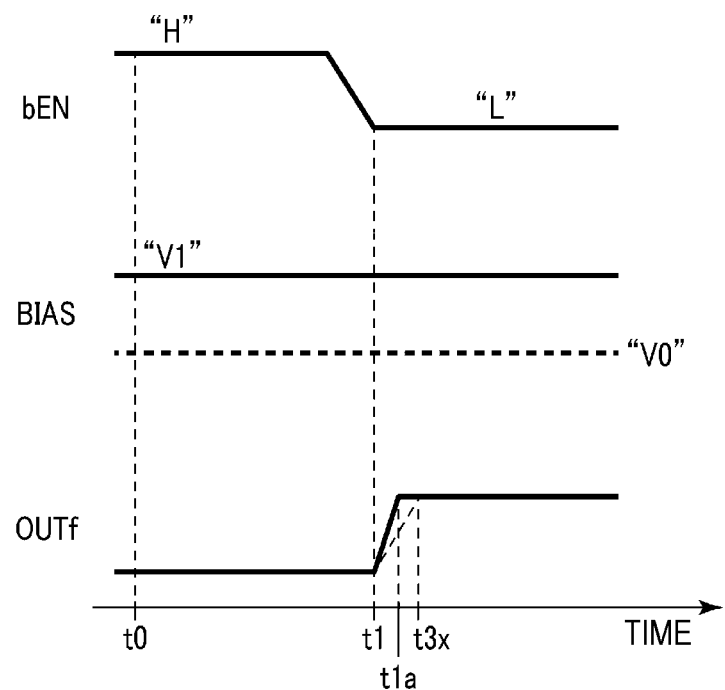
FIG. 28 is a timing diagram illustrating changes in performance in the sixth application example of the semiconductor device of the embodiment.

FIG. 28 is a view illustrating output characteristics of the analog circuit of the present application example. FIG. 28 illustrates in broken lines output characteristics of a conventional analog circuit that is functionally equivalent to the circuit in FIG. 26, as a Comparative Example.

In FIG. 28, the constant current source 81 outputs a current BIAS with a certain magnitude. The bias is supplied to the source/drain diffusion layer 102-n1f of the N-type transistor NTR1f.

When the control signal bEN is set to an "H" level, the P-type transistors PTR1f and PTR2f are set to an OFF state. Accordingly, the output terminal 85 is electrically isolated from the power supply terminal 88. Here, the N-type transistors NTR3f and NTR4f are set to an ON state. Accordingly, the output terminal 85 is electrically connected to the ground terminal 89.

The two P-type transistors PTR1f and PTR2f are connected in parallel between the power supply terminal 88 and the node ND2f. These transistors PTR1f and PTR2f are provided within the respective semiconductor regions AAp1f and AAp2f.

Accordingly, in the P-type transistors PTR1f and PTR2f, a relatively small LOD value causes the LOD effect. Thus, threshold voltages (absolute values) of the transistors PTR1f and PTR2f are relatively large. In the analog circuit 80 in an OFF state, off currents of the transistors PTR1f and PTR2f in an OFF state are reduced.

For this reason, when the control signal bEN is set to an "H" level, an off leakage current of the circuit 80 may be reduced.

The signal level of the control signal bEN is changed from an "H" level to an "L" level. When the control signal bEN is set to an "L" level, the transistors PTR1f and PTR2f are set to an ON state.

Accordingly, the output terminal 85 is electrically connected to the power supply terminal 88.

When the control signal bEN is set to an "L" level, the transistors NTR3f and NTR4f are set to an OFF state.

The two N-type transistors NTR3f and NTR4f are connected in parallel between the ground terminal 89 and the output terminal 85. These transistors NTR3f and NTR4f are provided within the common semiconductor region AAn3f. Accordingly, in the N-type transistors NTR3f and NTR4f, a relatively large LOD value causes the LOD effect. Thus, threshold voltages of the transistors NTR3f and NTR4f are larger than a threshold voltage of the transistor NTR2f. As a result, at the time of operation of the analog circuit 80, leakage currents of the transistors NTR3f and NTR4f in an OFF state are reduced.

For this reason, the analog circuit 80 in FIG. 26 may output a voltage value (a voltage of a signal level between an "H" level and an "L" level) between the power supply voltage VDD and the ground voltage VSS, from the output terminal 85 at a relatively high speed, according to the bias.

In this manner, the analog circuit of the present application example has improved performance characteristics.

(3) Summary

In a semiconductor device such as an LSI and a semiconductor memory, miniaturization of a size of a field effect transistor is in progress for the purpose of high integration of circuits.

Along with miniaturization of the field effect transistor, characteristics of the field effect transistor may be varied due to design parameters of the field effect transistor such as sizes of a source/drain diffusion layer and an element isolation layer.

In the semiconductor device of the embodiment, in consideration of a distance (LOD) between end portions of a gate electrode of a transistor and an element isolation area in the gate length direction, P-type and/or N-type field effect transistors are disposed/connected between a voltage terminal and an output terminal.

In the semiconductor device of the embodiment, between a driving voltage terminal (a power supply terminal/a ground terminal) and an output terminal of a circuit, two or more current paths including a plurality of transistors connected in series are connected in parallel.

Of two transistors connected in series, one transistor is provided within a semiconductor region where a plurality of transistors are disposed in common. Of the two transistors connected in series, one transistor is provided within one semiconductor region separately from other transistors. Accordingly, a plurality of transistors connected in series between a voltage terminal and an output terminal have respective LOD values. Between a voltage terminal and an output terminal (a certain node), a plurality of transistors having a parallel connection relationship have the same LOD values.

In the embodiment, in a plurality of transistors provided within a common semiconductor region AA, a relatively large LOD value is secured. When one transistor is provided within one semiconductor region, a relatively small LOD value is secured.

Accordingly, in the semiconductor device of the embodiment, an off leakage current of a field effect transistor may be reduced and an ON current of the field effect transistor may be increased.

As described above, the semiconductor device of the embodiment has improved performance characteristics.

(4) Others

The semiconductor device of the embodiment is not limited to the above described application example, and is applicable to a semiconductor device such as a logic gate, a digital circuit, an analog circuit, or a semiconductor memory (e.g., a flash memory, a random access memory).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit, of the inventions. The accompanying claims and their equivalents are intended to cover such forms or modifications as would fall within the scope and spirit of the inventions.

What is claimed is:

1. A semiconductor device comprising:
   a first node;
   a second node;
   first, second, and third semiconductor regions, each of which is surrounded by an isolation layer;
   first and second transistors of a first conductivity type connected in parallel between the first node and the second node, and provided within the first semiconductor region;
   a third transistor of the first conductivity type connected between the second node and the first transistor, and provided within the second semiconductor region; and
   a fourth transistor of the first conductivity type connected between the second node and the second transistor, and provided within the third semiconductor region, wherein gate electrodes of the first and second transistors extend in a first direction and are spaced from each other in a second direction that is perpendicular to the first direction, and gate electrodes of the third and fourth transistors also extend in the first direction, and a first distance which is equal to a longer of two distances between the element isolation layer and the gate electrode of the first transistor in the second direction, is greater than a second distance which is equal to a longer of two distances between the element isolation layer and the gate electrode of the third transistor in the second direction.

2. The semiconductor device according to claim 1, wherein the first conductivity type is a P conductivity type.

3. The semiconductor device according to claim 2, wherein the first node is an output node and the second node is a power supply node.

4. The semiconductor device according to claim 3, further comprising:
a first input node connected to the gates of the third and fourth transistors; and
a second input node connected to the gates of the first and second transistors, wherein
the first and second input nodes are input nodes of a NOR gate, and the output node is an output node of the NOR gate.

5. The semiconductor device according to claim 1, wherein the first conductivity type is an N conductivity type.

6. The semiconductor device according to claim 4, wherein the first node is a reference node and the second node is an output node.

7. The semiconductor device according to claim 6, further comprising:
a first input node connected to the gates of the third and fourth transistors; and
a second input node connected to the gates of the first and second transistors, wherein
the first and second input nodes are input nodes of a NAND gate, and the output node is an output node of the NAND gate.

8. The semiconductor device according to claim 1, wherein
the first semiconductor region has a first dimension in the second direction, which is larger than a second dimension of the second semiconductor region in the second direction and a third dimension of the third semiconductor region in the second direction.

9. The semiconductor device according to claim 1, wherein source/drain regions of each of the first, second, third, and fourth transistors are on either side of the respective gate electrode of the first, second, third, and fourth transistors in the second direction.

10. The semiconductor device according to claim 9, wherein the first and second transistors share a common source/drain region.

11. A NOR gate circuit comprising:
an output node;
a power supply node;
first, second, and third generally rectangular semiconductor regions, each of which is surrounded by an isolation layer;
first and second transistors of a P conductivity type connected in parallel between the output node and the power supply node, and formed within the first semiconductor region so that drain/source regions thereof are aligned in a first direction;

a third transistor of the P conductivity type connected between the power supply node and the first transistor, and formed within the second semiconductor region so that drain/source regions thereof are aligned in the first direction; and
a fourth transistor of the P conductivity type connected between the power supply node and the second transistor, and provided within the third semiconductor region so that drain/source regions thereof are aligned in the first direction, wherein
gate electrodes of the first, second, third, and fourth transistors extend in a second direction that is perpendicular to the first direction, and
a first distance which is equal to a longer of two distances between the element isolation layer and the gate electrode of the first transistor in the first direction, is greater than a second distance which is equal to a longer of two distances between the element isolation layer and the gate electrode of the third transistor in the first direction.

12. The NOR gate according to claim 11, further comprising:
a first input node connected to the gates of the third and fourth transistors; and
a second input node connected to the gates of the first and second transistors.

13. The NOR gate according to claim 11, wherein
the first semiconductor region has a first dimension in the first direction, which is larger than a second dimension of the second semiconductor region in the first direction and a third dimension of the third semiconductor region in the first direction.

14. The NOR gate according to claim 11, wherein source/drain regions of each of the first, second, third, and fourth transistors are on either side of the respective gate electrode of the first, second, third, and fourth transistors in the second direction.

15. The NOR gate according to claim 14, wherein the first and second transistors share a common source/drain region.

16. A NAND gate circuit comprising:
a reference node;
an output node;
first, second, and third generally rectangular semiconductor regions, each of which is surrounded by an isolation layer;
first and second transistors of an N conductivity type connected in parallel between the reference node and the output node, and formed within the first semiconductor region so that drain/source regions thereof are aligned in a first direction;
a third transistor of the N conductivity type connected between the output node and the first transistor, and formed within the second semiconductor region so that drain/source regions thereof are aligned in the first direction; and
a fourth transistor of the N conductivity type connected between the output node and the second transistor, and provided within the third semiconductor region so that drain/source regions thereof are aligned in the first direction, wherein
gate electrodes of the first, second, third, and fourth transistors extend in a second direction that is perpendicular to the first direction, and
a first distance which is equal to a longer of two distances between the element isolation layer and the gate electrode of the first transistor in the first direction, is greater than a second distance which is equal to a longer of two distances between the element isolation layer and the gate electrode of the third transistor in the first direction.

17. The NAND gate according to claim 16, further comprising:
   a first input node connected to the gates of the third and fourth transistors; and
   a second input node connected to the gates of the first and second transistors.

18. The NAND gate according to claim 16, wherein the first semiconductor region has a first dimension in the first direction, which is larger than a second dimension of the second semiconductor region in the first direction and a third dimension of the third semiconductor region in the first direction.

19. The NAND gate according to claim 16, wherein source/drain regions of each of the first, second, third, and fourth transistors are on either side of the respective gate electrode of the first, second, third, and fourth transistors in the second direction.

20. The NAND gate according to claim 19, wherein the first and second transistors share a common source/drain region.

\* \* \* \* \*